United States Patent
Morita

(10) Patent No.: US 8,473,095 B2
(45) Date of Patent: Jun. 25, 2013

(54) SUBSTRATE PROCESSING APPARATUS, METHOD OF DISPLAYING ERROR OF SUBSTRATE PROCESSING APPARATUS AND TRANSFER CONTROL METHOD

(75) Inventor: Osamu Morita, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 30 days.

(21) Appl. No.: 12/976,108

(22) Filed: Dec. 22, 2010

(65) Prior Publication Data

US 2011/0160900 A1 Jun. 30, 2011

(30) Foreign Application Priority Data

Dec. 28, 2009 (JP) ................................. 2009-298277
Nov. 11, 2010 (JP) ................................. 2010-252689

(51) Int. Cl.
*G06F 7/00* (2006.01)

(52) U.S. Cl.
USPC .............. 700/228; 700/245; 714/25; 714/37; 414/217; 345/204

(58) Field of Classification Search
USPC ................................................. 700/228, 213
See application file for complete search history.

(56) References Cited

U.S. PATENT DOCUMENTS

| | | | |
|---|---|---|---|
| 2005/0062848 A1* | 3/2005 | Satou | 348/115 |
| 2007/0067678 A1* | 3/2007 | Hosek et al. | 714/25 |
| 2007/0093939 A1* | 4/2007 | Kobayashi et al. | 700/245 |
| 2007/0126720 A1* | 6/2007 | Yamamoto et al. | 345/204 |
| 2007/0142952 A1* | 6/2007 | Yamamoto et al. | 700/110 |
| 2007/0146690 A1* | 6/2007 | Kim | 356/237.1 |
| 2007/0154211 A1* | 7/2007 | Kim | 398/9 |
| 2007/0248439 A1* | 10/2007 | Asari et al. | 414/217 |
| 2009/0106595 A1* | 4/2009 | Sarig et al. | 714/37 |

FOREIGN PATENT DOCUMENTS

| | | |
|---|---|---|
| JP | 11-307612 A | 11/1999 |
| JP | 2005-043950 A | 2/2005 |
| JP | 2008-227029 A | 9/2008 |

* cited by examiner

*Primary Examiner* — Gene Crawford
*Assistant Examiner* — Kyle Logan
(74) *Attorney, Agent, or Firm* — Volpe and Koenig, P.C.

(57) ABSTRACT

A substrate processing apparatus capable of easily checking a state of a transfer mechanism when an error occurs and readily determining a cause of the error is provided. The substrate processing apparatus includes at least one sensor provided in a transfer mechanism for transferring a substrate, a transfer control module for receiving sensing data transmitted by the at least one sensor, a transfer system controller for controlling the transfer control module, and a manipulation unit at least including a display unit for displaying a state of the transfer mechanism based on the sensed data. Therefore, when an error occurs, at least the sensed data transmitted by the at least one sensor is displayed on the display unit.

20 Claims, 18 Drawing Sheets

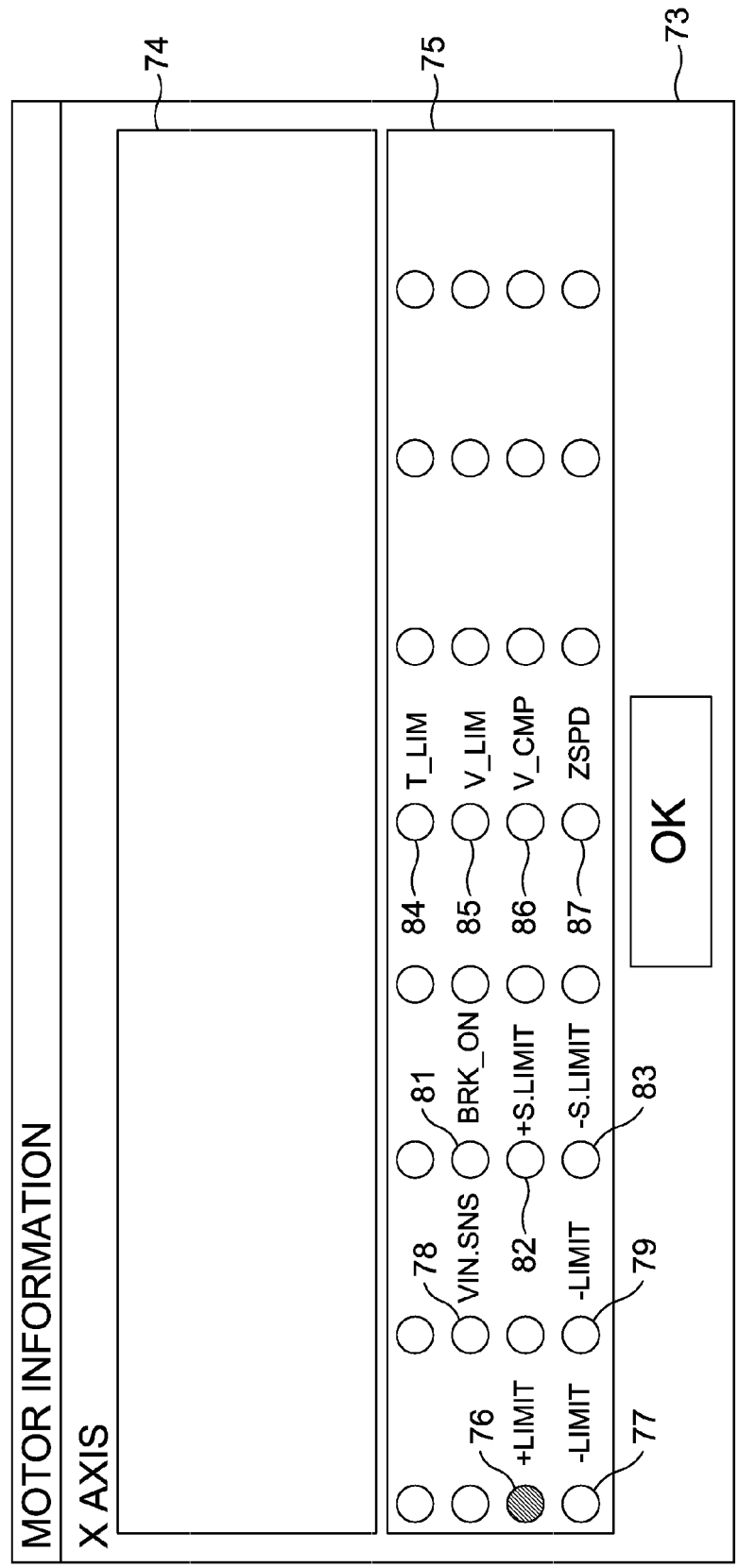

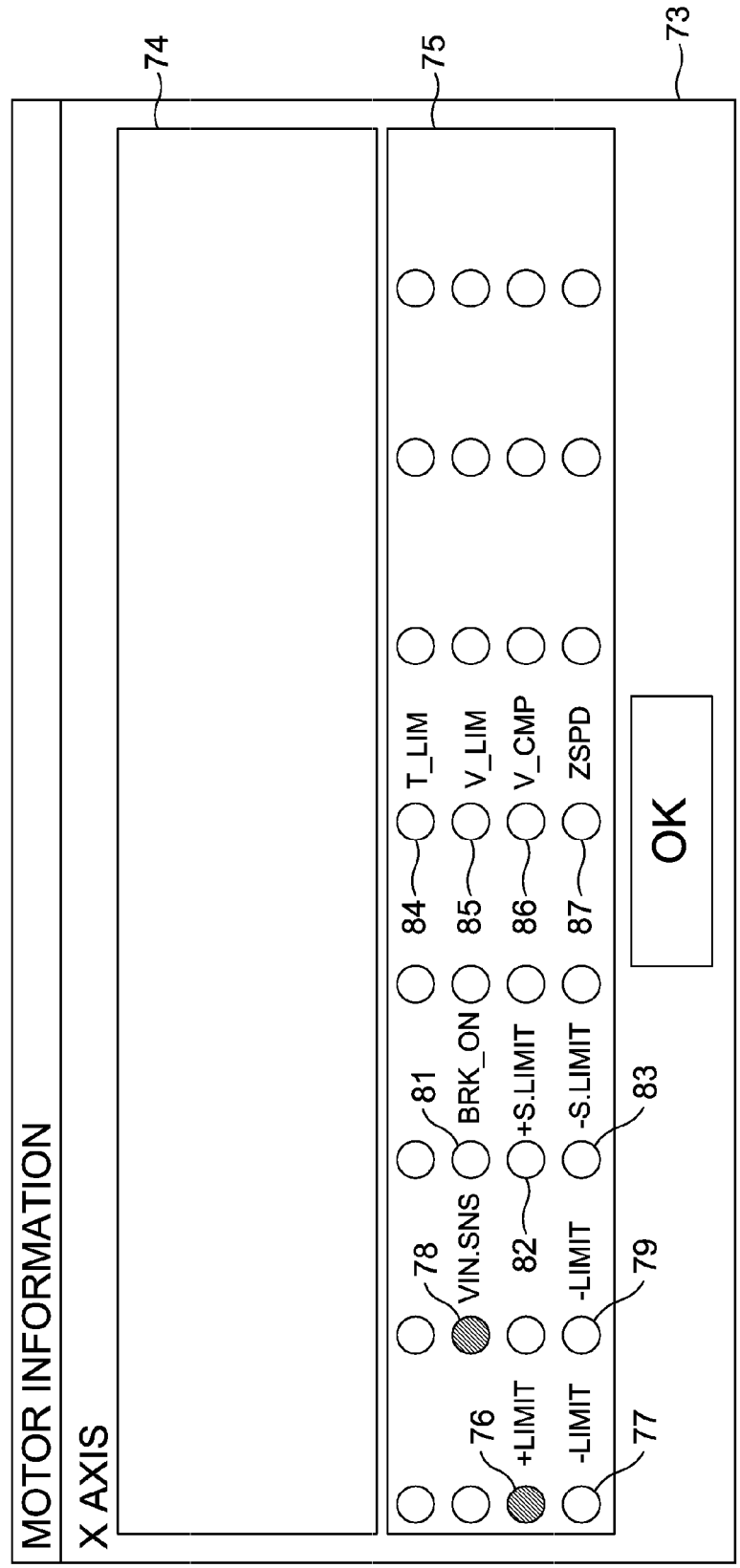

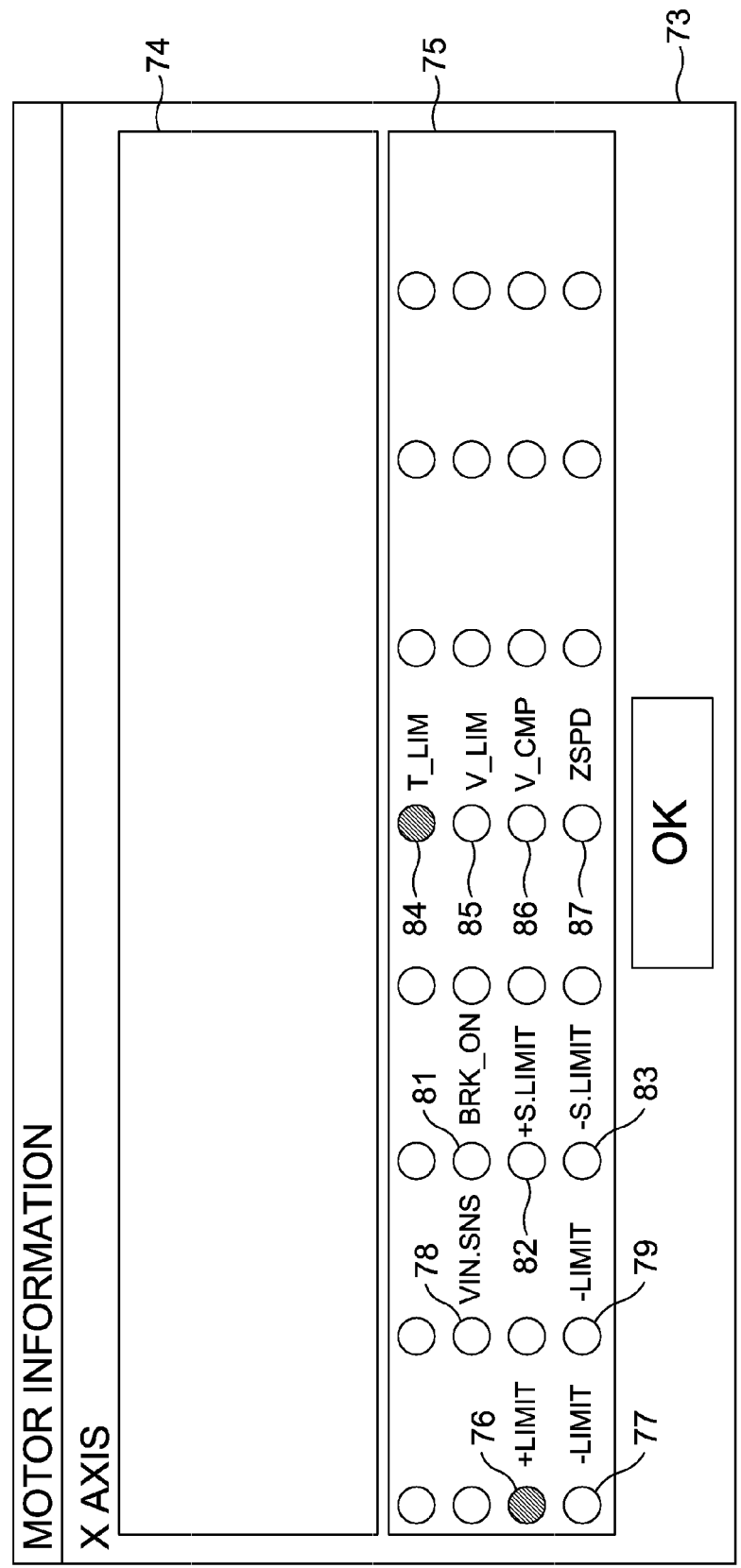

SUBSTRATE PROCESSING APPARATUS, METHOD OF DISPLAYING ERROR OF SUBSTRATE PROCESSING APPARATUS AND TRANSFER CONTROL METHOD

CROSS-REFERENCE TO RELATED PATENT APPLICATION

This application claims priority to and the benefit of Japanese Patent Applications Nos. 2009-298277 filed on Dec. 28, 2009 and 2010-252689 filed on Nov. 11, 2010, the disclosure of which is incorporated herein by reference.

1. FIELD OF THE INVENTION

The present invention relates to a substrate processing apparatus including a transfer mechanism having an improved abnormal pause function, a method of displaying an error of the substrate processing apparatus, and a transfer control method.

2. DESCRIPTION OF THE RELATED ART

A transfer mechanism for transferring a substrate is provided in a substrate processing apparatus. Various transfer mechanisms are operated under the control of a transfer control module. However, the transfer mechanisms may be abruptly paused due to an error.

SUMMARY OF THE INVENTION

When a transfer mechanism pauses due to an error in a conventional substrate processing apparatus, it is difficult to determine a state when the transfer mechanism pauses due to the error, which makes it difficult to determine a cause of the abnormal pause.

Therefore, in order to solve these problems, it is an object of the present invention to provide a substrate processing apparatus capable of easily checking a state of the transfer mechanism when an error occurs and readily determining a cause of the error, and a method of displaying an error of the substrate processing apparatus.

According to one embodiment of the present invention, there is provided a substrate processing apparatus comprising: at least one sensor provided in a transfer mechanism for transferring a substrate; a transfer control module for receiving a sensed data transmitted by the at least one sensor; a transfer system controller for controlling the transfer control module; and a manipulation unit at least including a display unit for displaying a state of the transfer mechanism based on the sensed data, wherein at least the sensed data transmitted by the sensor is displayed on the display unit when an error occurs.

According to another embodiment of the present invention, there is provided a method of displaying an error of a substrate processing apparatus, the apparatus comprising: at least one sensor provided in a transfer mechanism for transferring a substrate; a transfer control module for receiving a sensed data transmitted by the at least one sensor; a transfer system controller for controlling the transfer control module; and a manipulation unit at least including a display unit for displaying a state of the transfer mechanism based on the sensed data, the method comprising: displaying at least the sensed data transmitted by the at least one sensor on the display unit when the error occurs.

According to still another embodiment of the present invention, there is provided a transfer control method comprising steps of: (a) displaying a screen for monitoring at least a state of a transfer mechanism; (b) controlling the transfer mechanism to transfer a substrate by transmitting a control instruction data to a transfer control module for controlling the transfer mechanism; and (c) storing a sensed data transmitted by a sensor provided in each axis of the transfer mechanism in a storage means, wherein, in the step (b), a data including the sensed data in the storage means is displayed on the screen by the transfer control module when an error occurs.

According to the present invention, when an error occurs, a state of a transfer mechanism can be easily checked, and thus a cause of the error can be readily determined.

BRIEF DESCRIPTION OF THE DRAWINGS

FIG. 11 is an explanatory diagram of the manipulation screen illustrating one example of alarm information of the substrate processing apparatus according to one embodiment of the present invention.

DETAILED DESCRIPTION OF THE PREFERRED EMBODIMENTS

Figure 1:
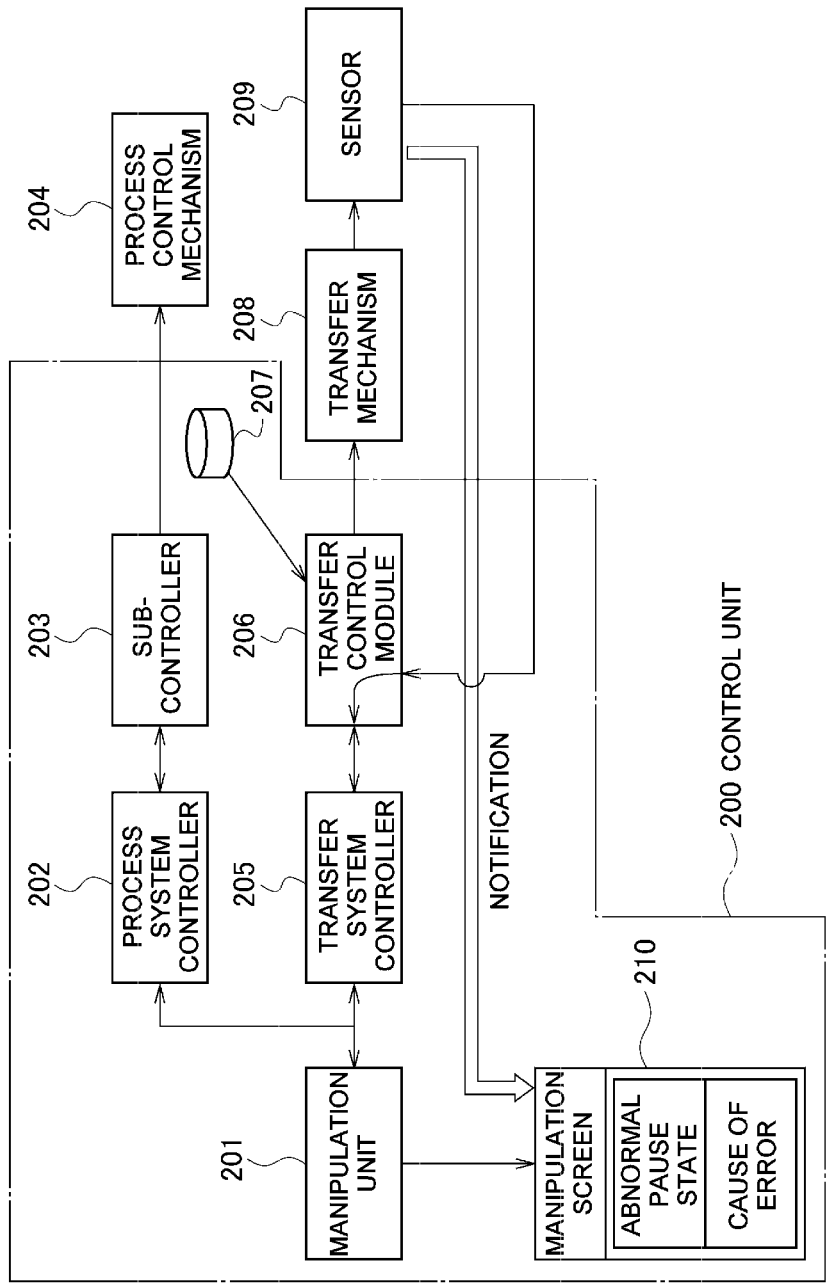
FIG. 1 is a block diagram illustrating a schematic configuration of a control device of a substrate processing apparatus according to one embodiment of the present invention.

Hereinafter, one embodiment of the present invention will now be described with reference to the accompanying drawings.

[Summary]

According to an embodiment of the present invention, a display unit for displaying an abnormal pause state and an abnormal pause cause is installed in a manipulation unit. The manipulation unit is informed of at least sensed data transmitted by a sensor provided in a transfer mechanism via a transfer control module for controlling the transfer mechanism, and the abnormal pause state and the abnormal pause cause are displayed on the display unit based on the sensed data. When the abnormal pause cause is displayed on the display unit as described above, the abnormal pause state and the abnormal pause cause can be exactly checked.

[Definition]

Hereinafter, the terms used in this specification will now be defined in detail. Files are various programs (stored as files) such as a general program, a setting program, a recipe, a communication program, an alarm information display program, and a parameter editing program. In the present invention, operation parameters are also set values of items in performing a motion control to be described later, such as a command position, a feedback position, a command speed, a feedback speed, a command torque, a position deviation, an alarm code, and a target position (coordinate system).

Also, a substrate processing mechanism refers to a mechanism for processing a substrate, and includes, for example, a heater drive unit, a gas supply mechanism, a gas exhaust mechanism, a furnace port opening and shutting mechanism 31, a wafer transfer mechanism (a substrate transfer mechanism) 24, a pod transfer device 15, an opening and shutting mechanism 22, a boat elevator 32, a substrate transfer container lid opening and shutting mechanism (a pod opener) 14, a valve opening and shutting mechanism, a mass flow controller, a pressure controller, etc.

Also, a transfer mechanism refers to the pod transfer device 15, the wafer transfer mechanism 24, the boat elevator 32, a boat 26, etc. Also, a process system controller refers to a process control unit 38 for controlling to process a substrate using a heating control unit, a valve opening and shutting mechanism/mass flow controller, a pressure controller, etc.

Also, a transfer control module 302 refers to a motion control unit for controlling each of the transfer mechanisms. Here, the motion control refers to controlling each motor according to an operation parameter as control instruction data and performing a position control of each axis of each motor. Also, motion control information is an item for setting conditions to perform the motion control with respect to each axis.

Also, the sensed data is data transmitted by each of sensors 65, 66 . . . , and 71.

Also, a cause of the error includes a positive limit signal, a negative limit signal, an emergency pause signal, a brake actuation signal, a positive soft limit signal, a negative soft limit signal, a torque limit execution signal, a speed limit execution signal, a speed matching signal, a zero speed detection signal, etc.

[Whole Configuration of Substrate Processing Apparatus]

First, the substrate processing apparatus put into practice in the present invention will be described with reference to FIGS. 12 and 13.

Figure 12:
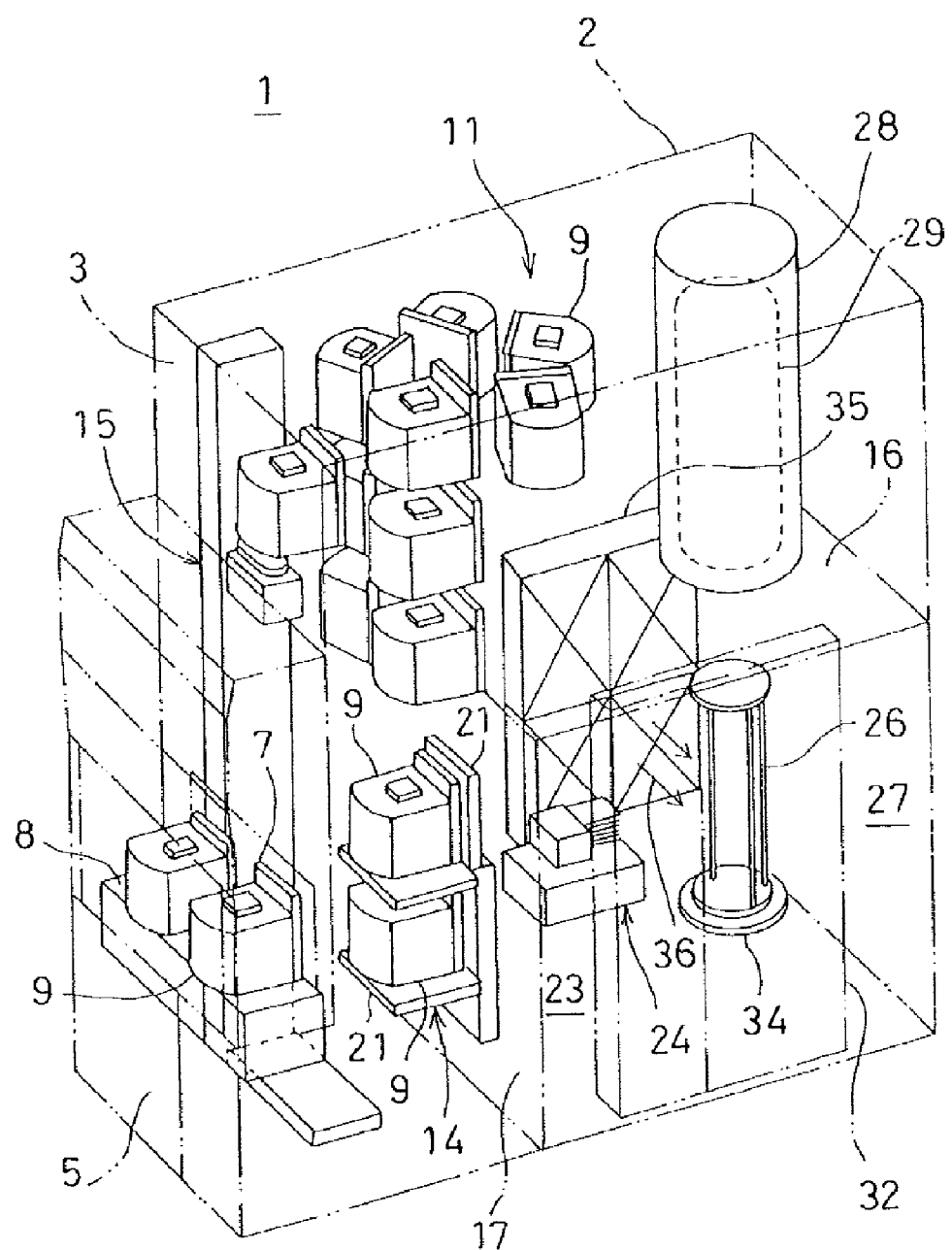
FIG. 12 is a perspective view illustrating the substrate processing apparatus according to one embodiment of the present invention.
Figure 13:
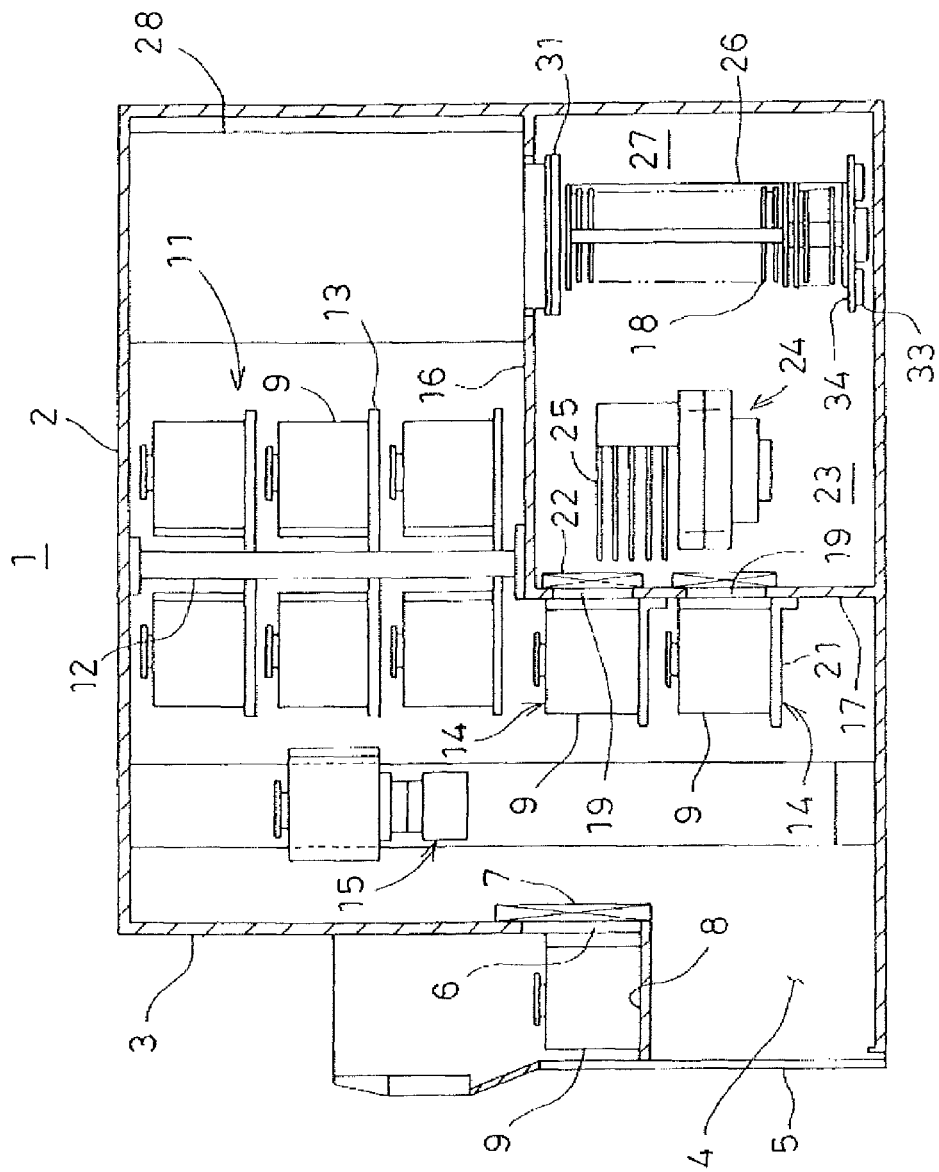
FIG. 13 is a lateral perspective view illustrating the substrate processing apparatus according to one embodiment of the present invention.

FIGS. 12 and 13 show a vertical substrate processing apparatus as one example of the substrate processing apparatus. Also, a wafer made of silicon is, for example, shown as a substrate to be processed in the substrate processing apparatus.

The substrate processing apparatus 1 includes a housing 2. As an opening installed to be able to perform a maintenance task, a front maintenance port 4 is arranged below a front wall 3 of the housing 2, and the front maintenance port 4 is switched on/off by a front maintenance door 5.

A pod loading/unloading port 6 is arranged in the front wall 3 of the housing 2 to communicate inner and outer parts of the housing 2 with each other, and the pod loading/unloading port 6 is opened and shut by a front shutter (a loading/unloading port opening/shutting mechanism) 7. Then, a load port (substrate transfer container delivery unit) 8 is installed right in front of the pod loading/unloading port 6, and the load port 8 is configured to adjust a position of a placed pod 9.

The pod 9 is a hermetically sealed substrate transfer container, and loaded onto the load port 8 and unloaded from the load port 8 by means of an in-process transfer device (not shown).

A rotary pod shelf (substrate transfer container storage shelf) 11 is installed at the top center inside the housing 2 in a longitudinal direction thereof, and the rotary pod shelf 11 is configured to store a plurality of pods 9.

The rotary pod shelf 11 includes a post 12 vertically installed and intermittently rotating and a plurality of shelf boards (substrate transfer container mounting shelves) 13 radially supported on the post 12 in each position of the center and lower end thereof. Here, the shelf board 13 is configured to store the pods 9 in a state where a plurality of pods 9 are placed.

A pod opener (a substrate transfer container lid switching mechanism) 14 is installed below the rotary pod shelf 11, and the pod opener 14 is configured to be able to mount the pod 9 and open and shut a lid of the pod 9.

A pod transfer device (container transfer device) 15 is installed among the load port 8 and the rotary pod shelf 11 and the pod opener 14. Here, the pod transfer device 15 is configured to support the pod 9, thereby allowing the pod 9 to elevate in a CZ-axis direction and retreat in a CX-axis direction, and to transfer the pod 9 among the load port 8, the rotary pod shelf 11 and the pod opener 14.

A sub-housing 16 is installed over the rear of the housing 2 at a lower central portion thereof in a longitudinal direction. A pair of wafer loading/unloading ports (substrate loading/unloading ports) 19 for loading/unloading a wafer (a substrate) 18 with respect to the sub-housing 16 are arranged in a front wall 17 of the sub-housing 16 while being disposed in two stages in a vertical direction, and the pod openers 14 are installed in the upper and lower wafer loading/unloading ports 19 and 19, respectively.

The pod opener 14 includes a placing unit 21 for placing the pod 9, and a opening/shutting mechanism 22 for opening and shutting the lid of the pod 9. The pod opener 14 is configured to open and shut a wafer entrance of the pod 9 by opening and shutting the lid of the pod placed on the placing unit 21 using the opening and shutting mechanism 22.

The sub-housing 16 constitutes a transfer chamber 23 that is airtight from a space (a pod transfer space) in which the pod transfer device 15 or the rotary pod shelf 11 is arranged. A wafer transfer mechanism (substrate transfer mechanism) 24 is installed in a front region of the transfer chamber 23, the wafer transfer mechanism 24 includes a desired number (five in the drawing) of wafer placing plates 25 for placing the wafer 18, and the wafer placing plates 25 may move linearly in a horizontal direction and rotate and elevate in a horizontal direction. The wafer transfer mechanism 24 is configured to charge and discharge the wafer 18 with respect to a boat (a substrate support port) 26.

Also, when the wafer placing plate 25 for supporting the wafer 18 receives the wafer 18 from a predetermined place and disposes the wafer 18 in another predetermined place, four parameters are set in the wafer transfer mechanism 24: the X axis for adjusting an operation of the wafer placing plate 25, the Y axis for adjusting an entrance angle when the wafer placing plate 25 transfers the wafer 18 to the boat 26, the Z axis for adjusting an entrance height when the wafer placing plate 25 transfers the wafer 18 to the boat 26, and the V axis for adjusting a distance for insertion of the wafer 18 to the boat 26 by finely adjusting the Z axis.

A standby unit 27 for receiving and allowing the boat 26 to wait is provided in a rear region of the transfer chamber 23, and a vertical processing furnace 28 is installed above the standby unit 27. The processing furnace 28 has a processing chamber 29 formed therein, a lower end of the processing chamber 29 becomes a furnace port unit, and the furnace port unit is opened and shut by a furnace port shutter (a furnace port opening and shutting mechanism) 31.

A boat elevator (a substrate support port elevation device) 32 for elevating the boat 26 is installed between a right end of the housing 2 and a right end of the standby unit 27 of the sub-housing 16. A seal cap 34 is horizontally installed as a lid in an arm 33 connected to an elevation stage of the boat elevator 32, and the seal cap 34 is able to vertically support the boat 26 and to airtightly close the furnace port unit in a state where the boat 26 is charged into the processing chamber 29.

The boat 26 is configured to horizontally support a plurality of (for example, approximately 50 to 125) wafers 18 at the center thereof.

A clean unit 35 is arranged in a position opposite to the boat elevator 32, and the clean unit 35 is composed of a supply fan and a dust filter to supply a cleaned atmosphere or a clean air 36 as an inert gas. A notch alignment device (not shown) for adjusting a circumferential position of the wafer 18 is installed as a substrate alignment device between the wafer transfer mechanism 24 and the clean unit 35.

The clean air 36 sprayed from the clean unit 35 is circulated through the notch alignment device (not shown), the wafer transfer mechanism 24 and the boat 26, and then inhaled by a duct (not shown). Then, the clean air 36 may be exhausted out of the housing 2, or sprayed into the transfer chamber 23 by means of the clean unit 35.

[Operation of Substrate Processing Apparatus]

Next, the operation of the substrate processing apparatus 1 will be described.

When the pod 9 is supplied to the load port 8, the pod loading/unloading port 6 is opened by the front shutter 7. The pod 9 placed on the load port 8 is loaded into the housing 2 via the pod loading/unloading port 6 using the pod transfer device 15, and placed on the appointed shelf board 13 of the rotary pod shelf 11. After the pod 9 is temporarily stored in the rotary pod shelf 11, the pod 9 is transferred from the shelf board 13 to one of the pod openers 14 using the pod transfer device 15, and transferred to the placing unit 21 or directly transferred from the load port 8 to the placing unit 21.

In this case, the wafer loading/unloading port 19 is closed by the opening and shutting mechanism 22, and the clean air 36 is circulated into the transfer chamber 23, which is then fully filled with the clean air 36. For example, as a nitrogen gas is fully filled as the clean air 36 into the transfer chamber 23, a concentration of oxygen is set to 20 ppm or less, that is, a concentration highly lower than a concentration of oxygen in an inner part (ambient atmosphere) of the housing 2.

As an opening side portion of the pod 9 placed on the placing unit 21 is compressed against an opening edge of the wafer loading/unloading port 19 in the front wall 17 of the sub-housing 16, and simultaneously its lid is separated by the opening and shutting mechanism 22, the wafer entrance is opened.

When the pod 9 is opened by the pod opener 14, the wafer 18 is extracted from the pod 9 using the wafer transfer mechanism 24, and transferred to the notch alignment device (not shown). After the wafer 18 is aligned in the notch alignment device, the wafer transfer mechanism 24 loads the wafer 18 onto the standby unit 27 disposed in the rear of the transfer chamber 23, and charges the wafer 18 into the boat 26.

The wafer transfer mechanism 24 that receives and transmits the wafer 18 from/to the boat 26 returns to the pod 9, and charges another wafer 18 into the boat 26.

While the wafer 18 is charged into the boat 26 by the wafer transfer mechanism 24 in one of the (upper or lower) pod openers 14, a separate pod 9 is transferred to the rotary pod shelf 11 by the pod transfer device 15 in the other of the (upper or lower) pod openers 14. Simultaneously, the pod 9 is opened by the other of the (upper or lower) pod openers 14.

When a preset number of the wafers 18 are charged into the boat 26, the furnace port unit of the processing furnace 28 that remains closed by the furnace port shutter 31 is opened by the furnace port shutter 31. In turn, the boat 26 is elevated by the boat elevator 32, and loaded into the processing chamber 29.

After the loading, the furnace port unit is airtightly closed by the seal cap 34.

The processing chamber 29 is vacuum-exhausted by a gas exhaust mechanism (not shown) so that it can be adjusted to a desired pressure (a degree of vacuum). Also, the processing chamber 29 is heated to a predetermined temperature with a heater drive unit (not shown) so that it can have a desired temperature distribution.

Also, a processing gas whose flow rate is controlled to a predetermined flow rate is supplied by a gas supply mechanism (not shown), and the processing gas is in contact with a surface of the wafer 18 while it is circulated through the processing chamber 29. In this case, a thin film is formed on the surface of the wafer 18 by a thermal chemical vapor deposition (CVD) reaction. After the reaction, the processing gas is also exhausted from the processing chamber 29 by means of the gas exhaust mechanism.

As a preset time goes by, an inert gas is supplied from an inert gas supply source (not shown) by means of the gas supply mechanism. In this case, the processing chamber 29 is replaced with the inert gas, and a pressure of the processing chamber 29 returns to a normal pressure as well.

The boat 26 is dropped via the seal cap 34 by the boat elevator 32.

For the unloading of the processed wafer 18, the wafer 18 and the pod 9 are discharged out of the housing 2 in the opposite order from that described above. The non-treated wafer 18 is charged into the boat 26, and batch processing of the wafer 18 is repeated.

[Control Unit]

First, a control unit 200 including a manipulation unit 201, a process system controller 202 and a transfer system controller 205 will be described with reference to FIG. 1. The process system controller 202 of the control unit 200 independently controls a variety of process control mechanisms including a gas supply mechanism for supplying a processing gas to the processing furnace 28, a gas exhaust mechanism for exhausting an inner part of the processing furnace 28, and a heater drive unit for heating the processing furnace 28 to a predetermined temperature. Also, the transfer system controller 205 of the control unit 200 controls a transfer mechanism 208 for transferring the wafer 18 to the processing furnace 28.

[Summary of Control Device]

Next, the summary of the control device according to one embodiment of the present invention will be described along with Comparative Example with reference to FIGS. 1 and 2.

The control device of the one embodiment shown in FIG. 1 includes a manipulation unit 201 having a display unit 210 installed therein to display a screen for writing or editing at least a predetermined file or a screen for monitoring a state of each of the substrate processing mechanisms. Also, a control unit 200 is provided, which includes a process system controller 202 for controlling to give an instruction to a subcontroller 203 for controlling each of the process control mechanism 204 and process a substrate according to the instruction from the display unit 210, etc., and a transfer system controller 205 for controlling to give an instruction to a transfer control module (motion control unit) 206 for controlling each of the transfer mechanism 208 and transfer the substrate. The control unit 200 is composed of the process system controller 202, the subcontroller 203, the transfer system controller 205 and the transfer control module 206.

A file including recipes is written or edited using a screen (a manipulation screen) of the display unit 210. The file is downloaded from the manipulation unit 201 to the transfer system controller 205. The transfer system controller 205 executes a predetermined instruction to the transfer control module 206 and controls each of the transfer mechanisms 208 based on the contents of the file downloaded from the manipulation unit 201. When the transfer mechanism 208 is abnormally paused, the manipulation unit 201 is configured to display at least the sensed data, which is notified of from each sensor 209 provided in each of the transfer mechanisms 208 via the transfer control module 206, on the display unit 210. According to such a configuration, since at least the sensed data is displayed on the manipulation screen of the display unit 210, an abnormal pause state and a cause of the error of each of the transfer mechanisms can be easily checked.

Also, a sensed data storage means 207 for storing at least the sensed data from each of the sensors 209 is installed. Since at least the sensed data is accumulated in the sensed data storage means 207, the manipulation unit 201 may be notified of the sensed data from an operation initiation to an operation termination of the motion control of each of the transfer mechanisms 208 from the sensed data storage means 207 via the transfer control module 206 when each of the transfer mechanisms 208 is abnormally paused. Using such notification, an abnormal pause state and a cause of the error of each of the transfer mechanisms can be easily checked. In order to check the abnormal pause cause with certainty, the sensed data may be the whole data from the operation initiation to the operation termination of the motion control.

[Control Device of Comparative Example]

Figure 2:
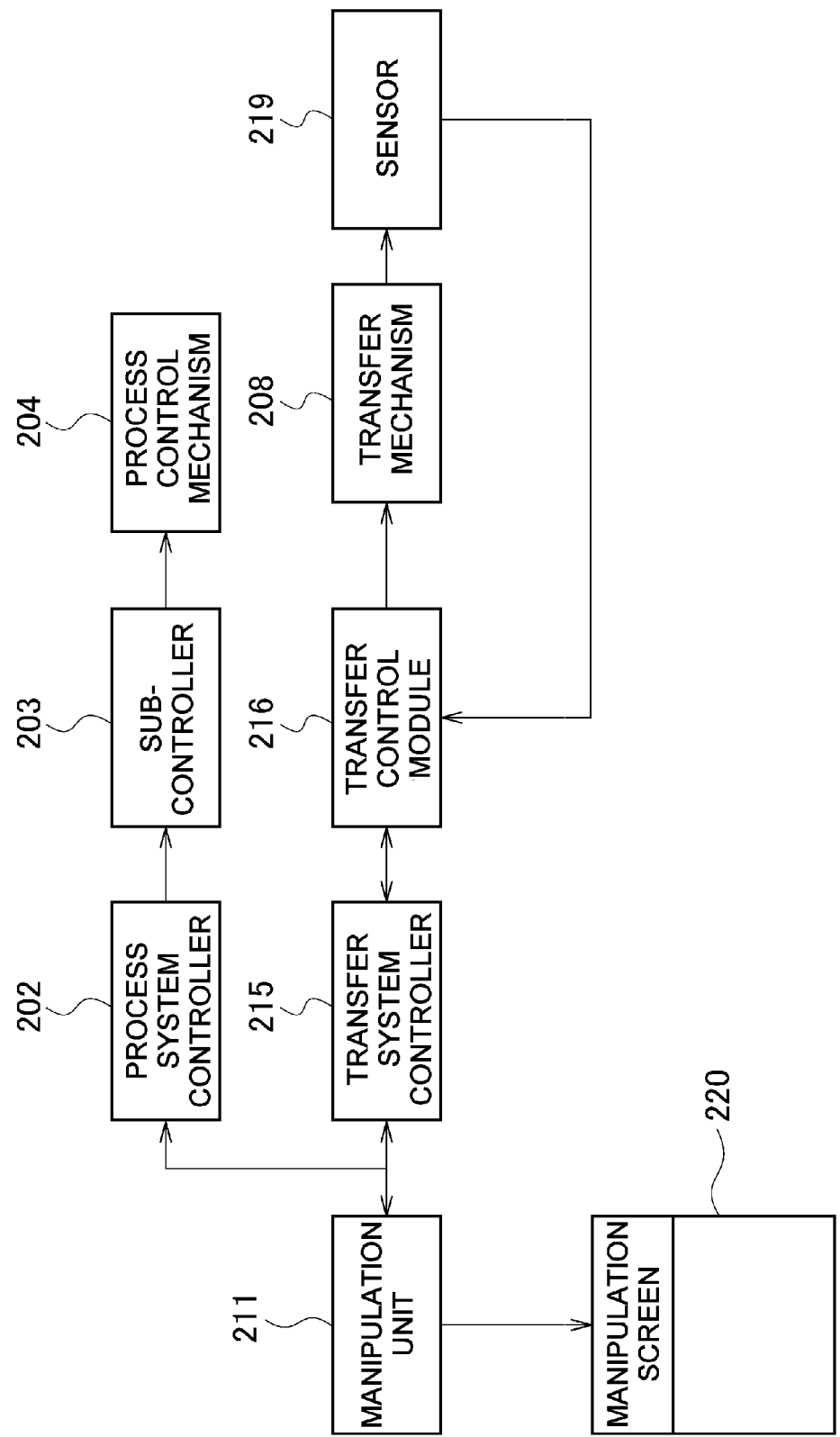
FIG. 2 is a block diagram illustrating a schematic configuration of a control device of a substrate processing apparatus according to Comparative Example as a premise of the present invention.

FIG. 2 shows a control device of Comparative Example.

Also, parts having the same functions as shown in FIG. 1 have the same reference numerals in FIG. 2, and their detailed description is omitted. In the control device of Comparative Example, the motion control state of each transfer mechanism 208 is not displayed on the display unit 220 of the manipulation unit 211. Also, the cause of the error is not displayed even when each of the transfer mechanisms 208 is abnormally paused. Also, a data storage means for accumulating information on the abnormal pause cause from the operation initiation to the operation termination of the motion control is not installed in the transfer control module 216. That is, the manipulation unit 211 is not notified of the sensed data from each of the sensors 219 via the transfer system controller 215.

According to a control device of the one embodiment of the present invention, since the manipulation unit is configured to display the sensed data, which is notified from each of the sensors provided in the transfer mechanism via the transfer control module, on the display unit, it may check a motion control state when an abnormal pause cause and an error of each of the transfer mechanisms are detected. Also, when the data storage means capable of accumulating the sensed data from the operation initiation to the operation termination of the motion control is installed in the transfer control module, and the accumulated sensed data is displayed on the display unit, history information including the abnormal pause cause may be confirmed. Therefore, the details of the motion control state when the abnormal pause cause and the error of each of the transfer mechanisms are detected can be exactly checked.

[Details of Control Device]

Next, the control device according to one embodiment of the present invention will be described in detail with reference to FIG. 3.

[Control Unit]

Figure 3:
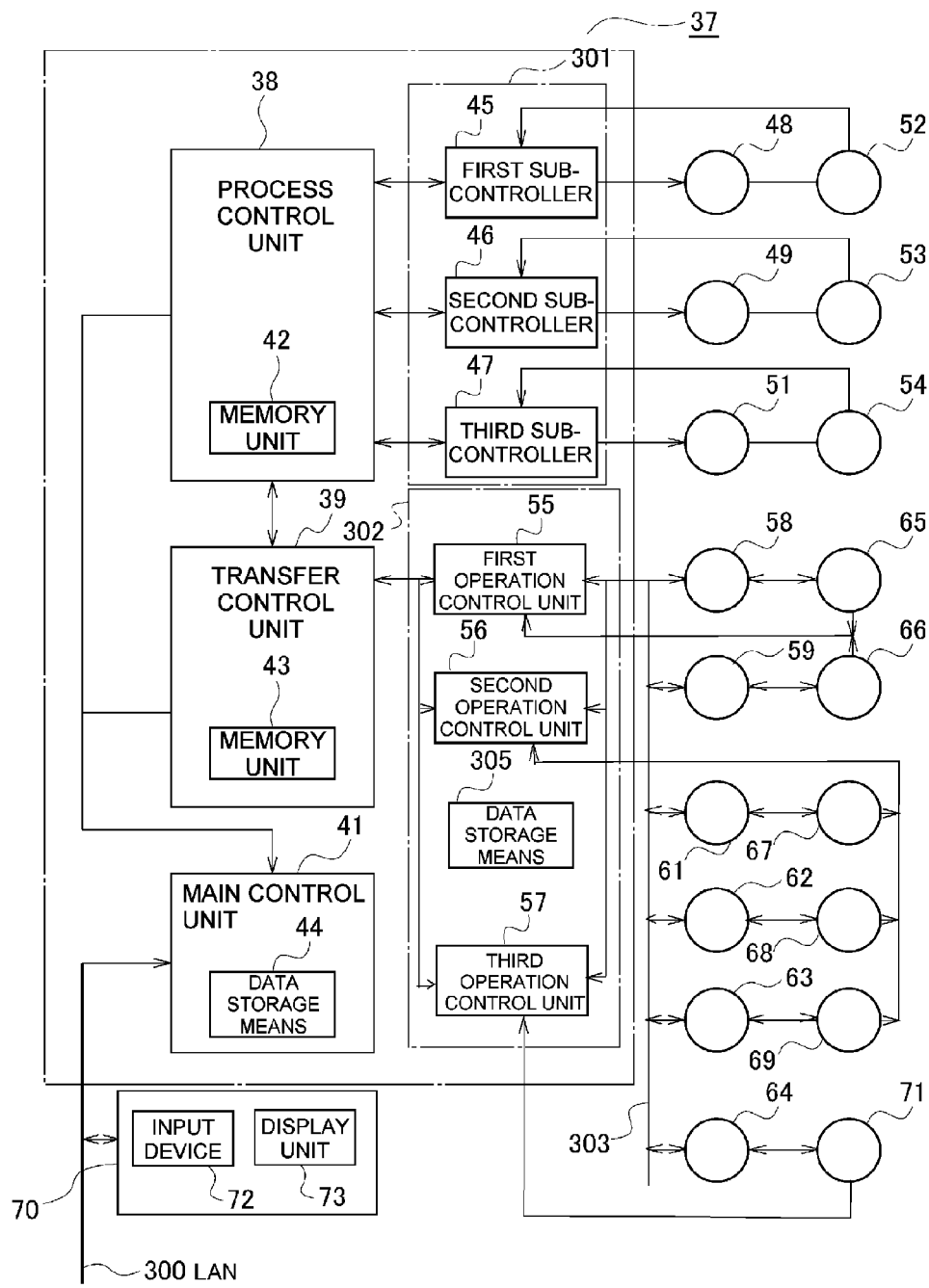
FIG. 3 is a block diagram illustrating a detailed configuration of the control device of the substrate processing apparatus according to one embodiment of the present invention.

In FIG. 3, reference numeral 38 represents a process control unit as the process system controller, reference numeral 39 represents a transfer control unit as the transfer system controller, and reference numeral 41 represents a main control unit. The process control unit 38 and the transfer control unit 39 are connected to the main control unit 41. The process control unit 38 includes a memory unit 42, and a process execution program required to execute a process is stored in the memory unit 42. The transfer control unit 39 includes a memory unit 43, and a transfer program for executing transfer processing of the wafer 18, an operation control program for controlling operations of transfer mechanisms such as the pod transfer device 15, the wafer transfer mechanism 24, the boat elevator 32, etc., and a data collection program for executing input/output of data between the transfer control unit 39 and a motion control unit 302 to be described later as the transfer control module are stored in the memory unit 43. The main control unit 41 includes a data storage means 44, and the data storage means 44 is composed, for example, of external memory devices such as a hard disk drive (HDD), etc. Also, the process execution program, the transfer program and the operation control program may be stored in the data storage means 44.

(Subcontroller)

Also, each of reference numerals 45, 46 and 47 illustrates a subcontroller 301. For example, reference numeral 45 represents a first subcontroller for executing heating control of the processing furnace 28, reference numeral 46 represents a second subcontroller for controlling a flow rate of a processing gas supplied to the processing furnace 28 by controlling an operation of a valve switching/mass flow controller, etc., and reference numeral 47 represents a third subcontroller for controlling exhaust of gas from the processing furnace 28 or controlling a pressure of the processing furnace 28.

(Actuator)

Also, each of reference numerals 48, 49 and 51 illustrates an actuator. For example, reference numeral 48 represents a heater (hereinafter, a first process actuator) controlled by the first subcontroller 45, reference numeral 49 represents a mass flow controller (hereinafter, a second process actuator) controlled by the second subcontroller 46, and reference numeral 51 represents a pressure control valve (hereinafter, a third process actuator) controlled by the third subcontroller 47.

(Sensors of Process Control Mechanism)

Also, reference numerals 52, 53 and 54 illustrate sensors for detecting a state of the actuator and feeding the detection results back to the first subcontroller 45, the second subcontroller 46 and the third subcontroller 47. For example, reference numeral 52 represents a temperature detector (a temperature sensor), reference numeral 53 represents a mass flow detector (a mass flow sensor), and reference numeral 54 represents a pressure detector (a pressure sensor). Also, one actuator is installed in each of the subcontrollers 45, 46 and 47, but the present invention is not limited to such a configuration. For example, a plurality of actuators may be installed in one subcontroller. Also, one detector (a sensor) is installed in each of the actuators 48, 49 and 51 in the same manner as described above, but a plurality of sensors may be installed in one actuator.

(Transfer Control Unit and Motion Control Unit)

Also, the transfer control unit 39 controls the motion control unit 302. The motion control unit 302 is composed of a first operation control unit 55, a second operation control unit 56 and a third operation control unit 57, all of which control actuators 58, 59 . . . to be described later. Also, the motion control unit 302 includes a sensed data storage means 305 for storing the sensed data detected by sensors 65, 66, . . . for detecting at least a state of actuators 58, 59 . . . to be described later. For example, the sensed data storage means 305 may be an external memory device such as an HDD, etc. Also, the motion control unit 302 may be configured to store a control instruction data (an operation parameter) transmitted from the transfer control unit 39 in the sensed data storage means 305.

(Actuator)

Also, reference numeral 58 represents a motor (hereinafter, a first actuator) for driving the pod transfer device 15 in a CX-axis direction, and reference numeral 59 represents a motor (hereinafter, a first actuator) for driving the pod transfer device 15 in a CZ-axis direction. Also, reference numeral 61 represents a motor (hereinafter, a second actuator) for driving the wafer transfer mechanism 24 in an X-axis direction, reference numeral 62 represents a motor (hereinafter, a second actuator) for driving the wafer transfer mechanism 24 in a Y-axis direction, and reference numeral 63 represents a motor (hereinafter, a second actuator) for driving the wafer transfer mechanism 24 in a Z-axis direction. Also, reference numeral 64 represents a motor (hereinafter, a third actuator) for driving the boat elevator 32.

(Sensors of Transfer Mechanisms)

Also, a plurality of state detection sensors 65, 66, 67, 68, 69 and 71 for detecting a state with respect to each axis are installed in each actuator. The plurality of state detection sensors 65, 66, . . . detect a state of whether or not there is a vibration, a speed or a critical point. Also, the state detection sensors 65, 66, 67, 68, 69 and 71 detect a state of each actuator, and feed the detected results (the sensed data) back from the first, second and third actuators 58, 59, 61, 62, 63 and 64 to the first operation control unit 55, the second operation control unit 56 and the third operation control unit 57 of the motion control unit 302 via a motion net 303. Here, one state detection sensor is installed in each actuator as shown in FIG. 3, but the present invention is not limited to such a configuration. Thus, a plurality of state detection sensors may be installed in one actuator. For example, a sensor for sensing a position in an X-axis direction, a sensor for sensing a position in a Y-axis direction, and a sensor for sensing a position in a Z-axis direction are installed in one actuator. Also, a plurality of (at least two) sensors for sensing a position in each axis direction may be further installed. Meanwhile, in this embodiment, the actuator and the state detection sensor are installed in a ratio of 1:1 for the sake of convenience.

(Functions of Motion Control Unit)

Also, the first operation control unit 55 controls driving of the pod transfer device 15 for transferring the pod 9 from the load port 8 to the placing unit 21, the second operation control unit 56 controls driving of the wafer transfer mechanism 24 for extracting the wafer 18 from the pod 9 and charging the wafer 18 into the boat 26, and the third operation control unit 57 controls driving of the boat elevator 32 for loading the boat 26 charged with the wafer 18 into the processing furnace 28. Also, during the driving control, the sensed data of each axis is temporarily stored in the sensed data storage means 305 while the driving control is being performed. After the driving control, for example when an object to be driven is transferred to a desired position, the sensed data temporarily stored in the sensed data storage means 305 is deleted when the sensed data is detection result data indicating that the operation (the motion) is OK. When the sensed data is detection result data indicating that the operation (the motion) is NG, the sensed data for each axis stored during the driving control is stored. When detection result data of one axis indicates the operation is NG, the sensed data of another axis is stored together with the sensed data of the one axis whose operation is detected to be NG even when the detection result data of another axis indicates the operation is OK. A data storage place is preferably the data storage means 44 of the main control unit 41. Also, the sensed data is stored in the sensed data storage means 305 even when the detection result data indicates that the operation (the motion) is OK, and the sensed data may be stored in the data storage means 44 of the main control unit 41 in a process in which the wafer 18 is processed inside the processing furnace 28 (that is, at a predetermined time after completion of the transfer process). Also, predetermined sensed data among the sensed data stored in the sensed data storage means 305 may be, for example, collected and stored in the data storage means 44, as will be described later. As described above, the sensed data is preferably stored in the certain data storage means 44 or the sensed data storage means 305, regardless of whether the detection result data indicates that the operation is OK or NG.

A control unit 37 is composed of the main control unit 41, the process control unit 38, the subcontroller 301, the transfer control unit 39 and the motion control unit 302.

[Manipulation Unit]

Reference numeral 72 represents an input device such as a keyboard, a mouse, and a manipulation panel, reference numeral 73 represents a display unit for displaying a manipulation screen, and reference numeral 70 represents a manipulation unit for inputting various instructions from the display unit 73 using the input device 72. The manipulation screen displayed on the display unit 73 may include a screen for writing or editing at least a predetermined file, a screen for monitoring states of each of the transfer mechanisms, and a screen for displaying information on occurring errors. The manipulation unit 70 is in contact with the main control unit 41 of the control unit 37 via a LAN 300. Also, the manipulation unit 70 may be in direct contact with the main control unit 41, or formed integrally with the main control unit 41.

(Functions of Process Control System)

A command signal for instructing a set value from the process control unit 38 or a command signal according to a process sequence is input to the first subcontroller 45, the second subcontroller 46 and the third subcontroller 47, and the process control unit 38 generally controls the first subcontroller 45, the second subcontroller 46 and the third subcontroller 47 based on the detection results detected by the first process sensor 52, the second process sensor 53 and the third process sensor 54.

Also, the process control unit 38 executes substrate processing according to an instruction from the manipulation unit 70 via the main control unit 41. The substrate processing is executed independently from other control systems according to a program stored in the memory unit 42 of the process control unit 38. Therefore, the substrate processing is completed without interruption even when a fault occurs in the transfer control unit 39 and the main control unit 41.

(Functions of Actuator)

Whether or not a torque control is executed or not executed is set in advance in each of the actuators 58, 59, 61, 62, 63 and 64. Also, operation parameters such as a target position, a speed, acceleration, deceleration and a torque limit value are set in advance from the manipulation unit 70 via the transfer control unit 39. Also, an operation parameter is input as a command signal from the main control unit 41 to the transfer control unit 39 according to a process sequence.

(Feedback Control Functions of Motion Control Unit)

The first operation control unit 55 constituting the motion control unit 302 controls the first actuators 58 and 59 based on the detection result data detected by the state detection sensors 65 and 66. Also, the second operation control unit 56 controls the second actuators 61, 62 and 63 based on the detection result data detected by the state detection sensors 67, 68 and 69. Further, the third operation control unit 57 controls the third actuator 64 based on the detection result data detected by the state detection sensor 71. As described above, the operation control units 55, 56 and 57 independently control actuators 58, 59 . . . corresponding to the state detection sensors 65, 66 . . . , respectively. Therefore, even when a transfer error occurs, the transfer mechanisms in which an error does not occur may continue to perform a transfer operation without pausing all of the transfer mechanisms.

Here, the motion control unit 302 is a control unit having a function of outputting a pulse signal to a motor driver at an assigned pulse number or frequency. More particularly, the motion control unit 302 automatically outputs a control pulse to a motor driver according to the operation parameters such as a target position, a speed, and an acceleration/deceleration rate. Also, the motor driver has various limit input functions required for positioning control. The control of a motor body as the actuator is executed by the motor driver. The motion control outputs the pulse signal to the motor driver and indirectly controls the motor.

Also, the motor driver is a drive unit for driving a stepping motor and a Servo motor. The control of the motor is executed by executing setting/acquisition of a control signal with respect to the drive unit.

Also, each of the operation control units 55 through 57 accumulates the sensed data including the detection result data, which is detected in state sensors 65 through 71 installed in each of the actuators 58 through 64, in the sensed data storage means 305 of the motion control unit 302 based on the data collection program stored in the memory unit 43 of the transfer control unit 39.

Also, each of the operation control units 55 through 57 transmits the sensed data accumulated in the sensed data storage means 305 to the transfer control unit 39 based on the data collection program.

Also, the motion control unit 302 directly notifies the manipulation unit 201 of the sensed data from each of the sensors 65, 66, 67, 68, 69 and 71 provided in the transfer mechanism to be controlled, or notifies the transfer control unit 302 of the sensed data and reports the sensed data to the manipulation unit 201. Also, when the motion control unit 302 is notified of the sensed data of each axis, it is possible to (1) notify the motion control unit 302 of a trigger for terminating the motion control, (2) refer to an interrelation between a change in value of an encoder installed inside the motor and the input sensed data (sensor information), (3) determine an abnormal pause cause from the sensed data when the motion control is abnormally paused, and (4) exactly check a current state of the motor driver. Also, the motion control unit 302 may be configured to transmit only a finally accumulated sensed data among the sensed data accumulated in the sensed data storage means 305 to the transfer control unit 39 and delete the other sensed data when an operation of the transfer mechanism is normally ended.

(Functions of Transfer Control Unit)

Also, the transfer control unit 39 executes the transfer processing according to an instruction from the manipulation unit 70, and the pod 9 and the wafer 18 are also transferred independently from the other control systems according to the transfer program and the operation control program stored in the memory unit 43 of the transfer control unit 39. Therefore, even when a fault occurs in the process control unit 38 and the main control unit 41, the transfer processing of the wafer 18 is completed without interruption.

Also, the transfer control unit 39 transmits the sensed data of which the main control unit 41 is notified from the motion control unit 302, and the main control unit 41 stores the sensed data in the data storage means 44. Here, the main control unit 41 reports the stored sensed data to the manipulation unit 70.

(Functions of Data Storage Means)

Various programs, such as a program for generally managing substrate processing proceedings, a setting program for setting up processing contents and a processing condition, a substrate processing recipe in which setting information on heating of the processing furnace 28 and supply and exhaust of a processing gas is stored, a communication program, an alarm information display program, a parameter editing program, etc., are stored as files in the data storage means 44 of the main control unit 41.

(Various Programs)

The communication program executes transmission/reception of data via a communication means such as the process control unit 38, the transfer control unit 39 or the LAN 300. Also, the communication program allows the transfer control module 302 and each of the actuators 58, 59 . . . to execute transmission/reception of data via a motion net 303. Also, the alarm information display program displays alarm information on a cause of an error, for example, a pause cause of the actuators 58, 59, 61, 62, 63 and 64, on the display unit 73 when the error is detected by the state detection sensors 65, 66, 67, 68, 69 and 71, and the parameter editing program controls driving of the actuators 58, 59, 61, 62, 63 and 64, or executes editing of parameters required to set up a pause condition of the transfer mechanism using a torque limit value.

Also, the data storage means 44 includes a data storage region. Here, a parameter required to transfer the wafer 18 is stored in the data storage region, and setting information set in advance in the transfer mechanism and information such as a processing state are also stored. Also, the data storage means 44 may be configured to store the sensed data detected by the state detection sensors 65, 66, 67, 68, 69 and 71.

(Actuator)

The presence of the torque control which the actuators 58, 59, 61, 62, 63 and 64 themselves have is input in advance as the setting information in the actuators 58, 59, 61, 62, 63 and 64.

[Schematic Configuration of Transfer Control System of Substrate Processing Apparatus]

Figure 4:
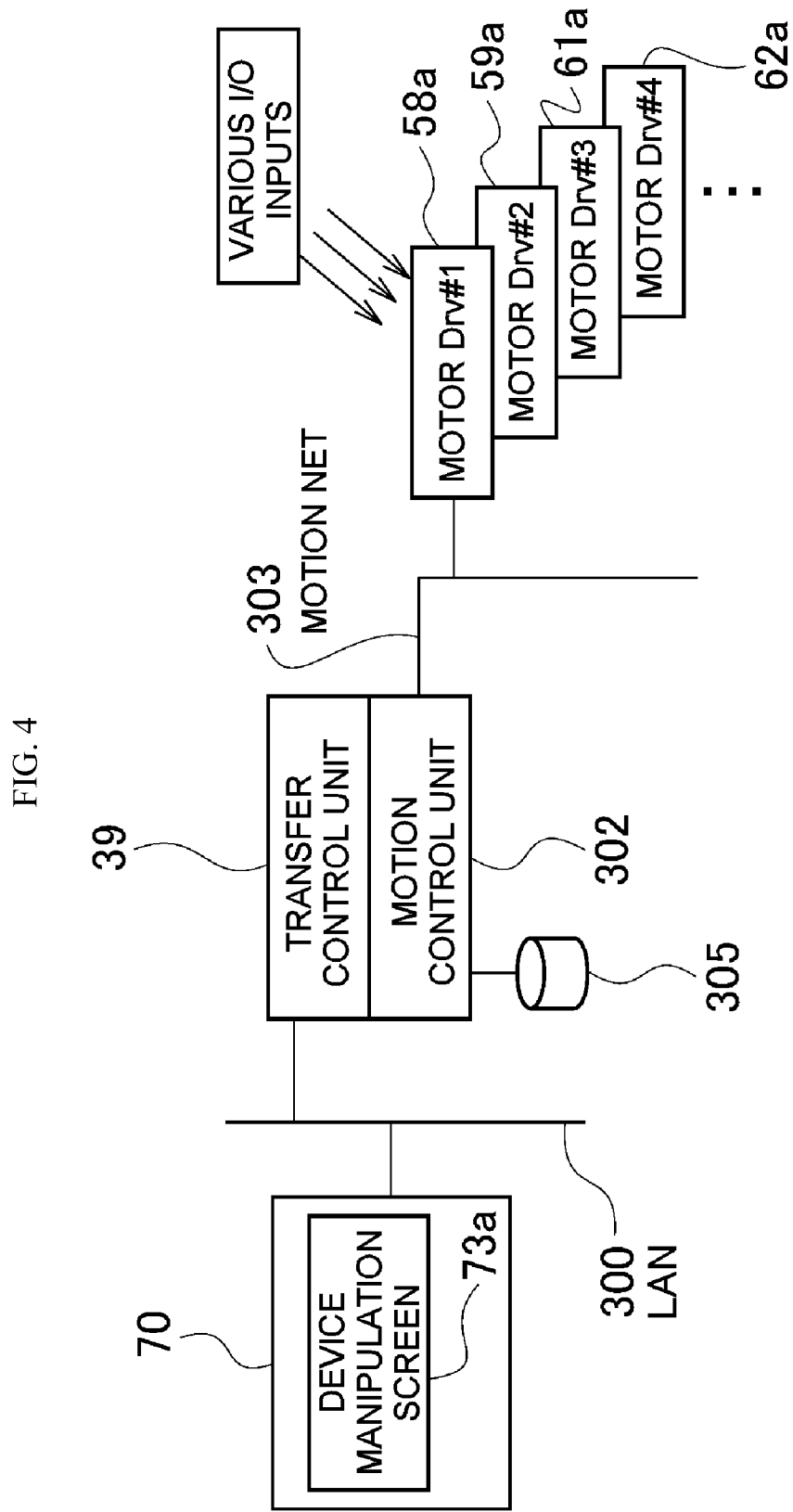
FIG. 4 is a block diagram illustrating a schematic configuration of a transfer control system of the substrate processing apparatus according to one embodiment of the present invention.

Next, a schematic configuration of a transfer control system of the substrate processing apparatus according to one embodiment of the present invention will be described with reference to FIG. 4.

The manipulation unit 70 in which a device manipulation screen 73*a* is installed in the display unit is connected to the transfer control unit 39 via the LAN 300. The motion control unit 302 is installed in the transfer control unit 39. The motion control unit 302 is connected to the motor drivers Drv#1, Drv#2 . . . of each of the transfer mechanisms via the motion net 303. The connection via the motion net 303 serves to control each axis of each of the transfer mechanisms to be controlled at the same cycle.

The motion control unit 302 includes the sensed data storage means 305 for storing information on an abnormal pause cause as a history during the motion control.

Various I/O inputs are input to the motor drivers Drv#1, Drv#2 . . . . The various I/O inputs are, for example, the sensed data from the sensors installed in each of the transfer mechanisms. The motion control unit 302 outputs a pulse signal with respect to each of the motor drivers Drv#1, Drv#2 . . . , and controls a motor of each of the transfer mechanisms. The transfer control unit 39 may be, for example, composed of a personal computer. The motion control unit 302 may be, for example, composed of a motion control board mounted in the personal computer.

[Signal Flow]

Next, the signal flow of the transfer control system of the substrate processing apparatus as shown above in FIG. 4 will be described with reference to FIG. 5. The transfer control unit 39 transmits an operation instruction request (MDC) for the transfer processing to the motion control unit 302 based on a command C from the manipulation unit 70. The motion control unit 302 receiving the MDC conveys an operation command (a control command, MC) to motor drives 58*a*, 59*a* . . . . The motor drives 58*a*, 59*a* . . . receiving the MC respond with a reception acknowledge signal (RAS) to the motion control unit 302. The motion control unit 302 receiving the RAS transmits an operation instruction response (MDR) to the transfer control unit 39.

The motion control unit 302 observes an operation termination signal of the motor in order to observe an operation termination of the transfer mechanism. Also, the motion control unit 302 transmits an axis monitor collection request (MCC) to each of the motor drivers 58*a*, 59*a* . . . . The MCC is requested at the same cycle with respect to each of the motor drivers 58*a*, 59*a* . . . . A time axis is adjusted by transmitting the MCC at the same cycle. After a cycle interval $T_3$ where chattering information may be collected after the transmission of the MCC, that is, a time when a chattering removal is executed, the motion control unit 302 collects axis monitor data (MD) from each of the motor drivers 58*a*, 59*a* . . . . The collected MD is accumulated in the sensed data storage means 305 installed in the motion control unit 302.

When at least one of the actuators 58, 59, 61, 62, 63 and 64 is paused, an alarm signal is transmitted form the corresponding motor drives 58*a*, 59*a* . . . to the motion control unit 302. The motion control unit 302 receiving the alarm signal suspends the collection of the MD, which is data including the sensed data from each of the sensors 65, 66 . . . , into the data storage means 305. The motion control unit 302 notifies the transfer control unit 39 of an alarm signal (EAN) when an error occurs in the corresponding actuator. The notification includes the whole MD accumulated until the actuators 58, 59, 61, 62, 63 and 64 are paused. Also, the motion control unit 302 notifies the transfer control unit 39 of an operation termination notification (MFN) of the transfer system mechanism.

[Timing]

Figure 5:
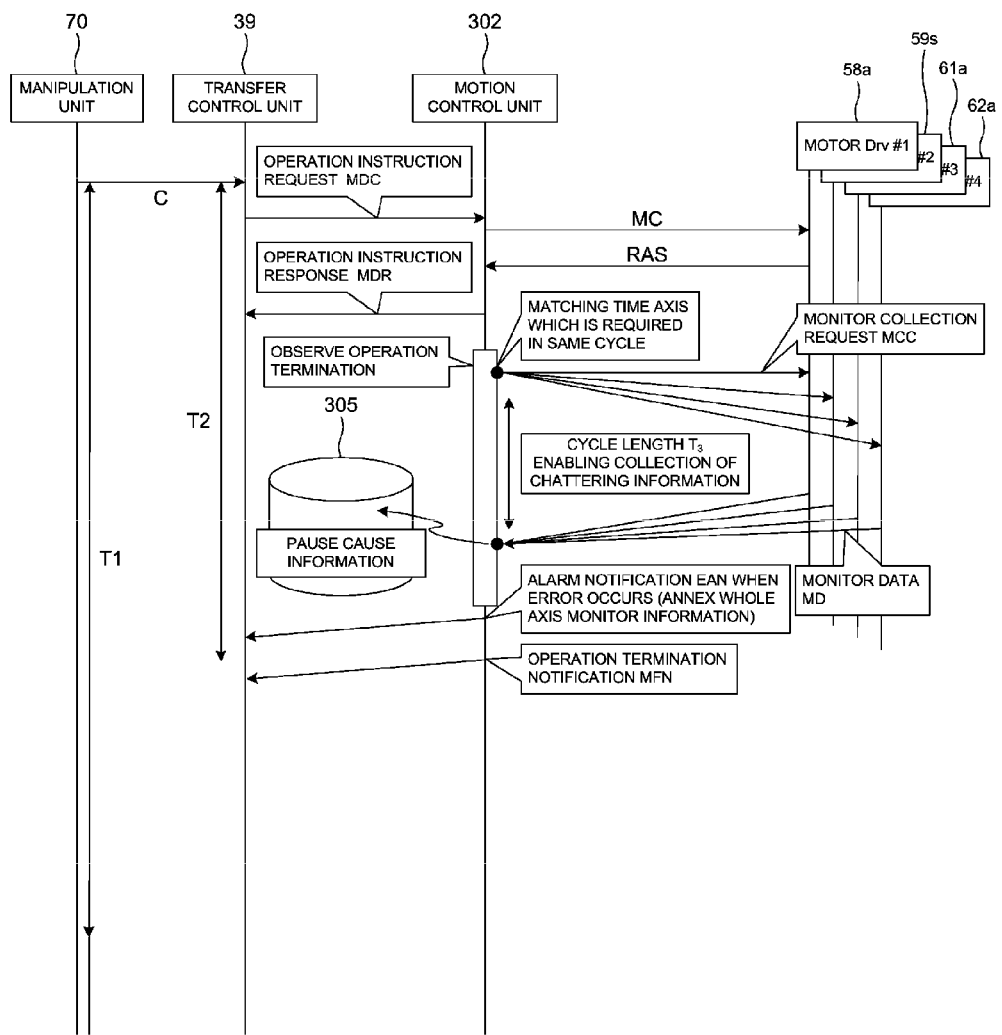
FIG. 5 is a diagram illustrating a signal flow control operation of the transfer control system of the substrate processing apparatus according to one embodiment of the present invention.

In the signal flow as shown in FIG. 5, a control cycle $T_3$ between the motion control unit 302 and the motor drives 58*a*, 59*a* . . . , a control cycle $T_2$ between the motion control unit 302 and the transfer control unit 39, and a control cycle $T_1$ between the transfer control unit 39 and the manipulation unit 70 are, for example, set to several hundred microseconds (μsec) to several milliseconds (msec), several msec and several seconds (sec), respectively. In particular, data collection may be performed at a small cycle in which the ON/OFF of the sensors 65, 66 . . . may be recognized by setting a cycle interval $T_3$, in which chattering information between the motion control unit 302 and the motor drives 58*a*, 59*a* . . . may be collected, for several hundred μsec to several msec. Therefore, it is possible to choose the ON/OFF of the sensors 65, 66 . . . , that is, to prevent an error of the sensed data. For example, the cycle interval $T_3$ is 2 msec or less. Also, theses cycle intervals are preferably relatively shorter for improvement of performance.

[Transfer Control]

Next, the flow of the wafer transfer processing will be described with reference to FIG. 6.

(Wafer Transfer Processing)

When the transfer processing of the wafer 18 is executed, set values such as a target position, a speed, acceleration, deceleration, a direction in which the torque control is executed, and a torque limit value when the torque control is executed are input from the manipulation unit 70, in addition to the presence of the preset torque control (step 602), and an execution instruction of the transfer processing is input (step 603). The sensed data of the sensed data storage means 305 installed in the motion control unit 302 is cleared (step 604), and the operation control program is then executed according to the transfer program and the instruction from the transfer program stored in the memory unit 43 (step 605). Also, the collection of the sensed data from each of the sensors 65, 66 . . . 71 is initiated based on the data collection program (step 606).

(Execution of Transfer Program)

When the transfer program is executed, the transfer control unit 39 controls driving of each of the transfer mechanisms of the pod transfer device 15, the wafer transfer mechanism 24 and the boat elevator 32 via the motion control unit 302 (the first operation control unit 55, the second operation control unit 56 and the third operation control unit 57) (step 607).

(Torque Control)

Also, if the torque control set in advance in the actuators 58, 59, 61, 62, 63 and 64 is executed, when a set value input from the manipulation unit 70 is used as a limit value, and at least one of the motor drivers 58*a*, 59*a*, 61*a*, 62*a*, 63*a* and 64*a* installed respectively in the actuators 58, 59, 61, 62, 63 and 64 has a value greater than the limit value, the actuators 58, 59, 61, 62, 63 and 64 for driving the corresponding transfer mechanisms are paused, and an alarm signal is transmitted to the motion control unit 302 simultaneously.

(Determination of Wafer Transfer Processing)

The motion control unit 302 determines whether or not the actuators 58, 59, 61, 62, 63 and 64 are paused during the transfer processing based on the sensed data when the transfer mechanism is paused (step 608).

(Normal Termination of Wafer Transfer Processing)

When none of the actuators 58, 59, 61, 62, 63 and 64 are paused during the transfer processing, the transfer processing of the wafer 18 is determined to be normally terminated (step 609). In this case, only final sensed data (detection result data) of the corresponding transfer processing is supported to the sensed data storage means 305 (step 610), and the processing is terminated. Here, when the transfer processing is normally terminated, the supporting of only the final sensed data of the corresponding transfer processing to the sensed data storage means 305 is due to an effective use of the data storage means 305. Also, the final sensed data may be transmitted to the memory unit 43 of the transfer control unit 39.

(Pause of Actuator)

When at least one of the actuators 58, 59, 61, 62, 63 and 64 is paused, the collection of the sensed data detected by the state detection sensors 65, 66, 67, 68, 69 and 71 is terminated (step 611). Also, the transfer control unit 39 is notified of the sensed data accumulated from the motion control unit 302 into the sensed data storage means 305 together with an alarm signal, the main control unit 41 is notified of the sensed data indicating a pause cause of the corresponding actuator via the transfer control unit 39 together with the alarm signal (step 612), the alarm information display program is executed by the notification of the alarm signal (step 613), and alarm information is displayed on the monitor 73 (step 614).

(Abnormal Termination of Transfer Processing)

Also, when at least one of the actuators 58, 59, 61, 62, 63 and 64 is paused and the main control unit 41 is notified of the alarm signal, a command for suspension of the transfer processing of the wafer 18 is instructed to the transfer control unit 39 (step 615). As all the actuators are paused (step 616), the transfer processing of the wafer 18 is suspended (step 617), and the processing is terminated.

[Detailed Description of Step 614]

Step 614 of displaying alarm information will be described in detail with reference to FIG. 7. First, alarm information is displayed on a system main screen to be described later (step 701), and a fault information list is displayed on the manipulation screen 73a according to a predetermined manipulation (step 702). When predetermined information is selected from the fault information list (step 703), a capture screen in which a system main screen is captured during the abnormal pause is displayed (step 704). An axis monitor screen for displaying each axis of each transfer mechanism is displayed from a transfer main screen in which icons of the respective transfer mechanisms in the capture screen are displayed (step 705). The abnormally paused transfer mechanism, for example, a wafer transfer unit, is displayed (step 706). When a screen display region of the wafer transfer unit is clicked, it is changed into an enlarged view of the wafer transfer unit, an abnormal axis, for example, the Y axis, is displayed (step 707). When a display region of the displayed Y axis is clicked, a motion control state screen for determining an abnormal pause in the last place is displayed (step 708).

[Sensed Data Display Manipulation in Abnormal Pause]

Figure 6:
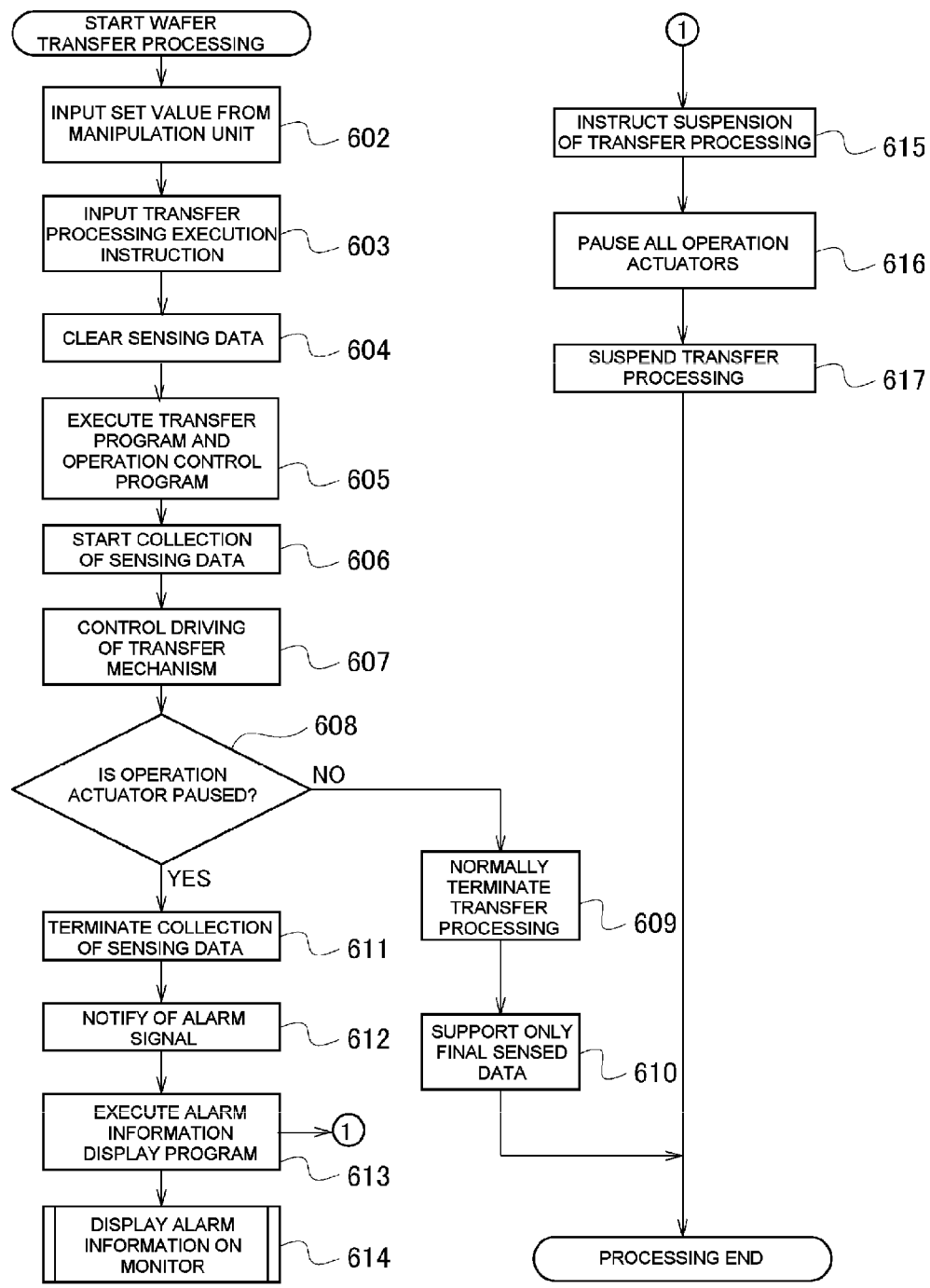
FIG. 6 is a flowchart illustrating a flow of motion control processing of the substrate processing apparatus according to one embodiment of the present invention.
Figure 7:
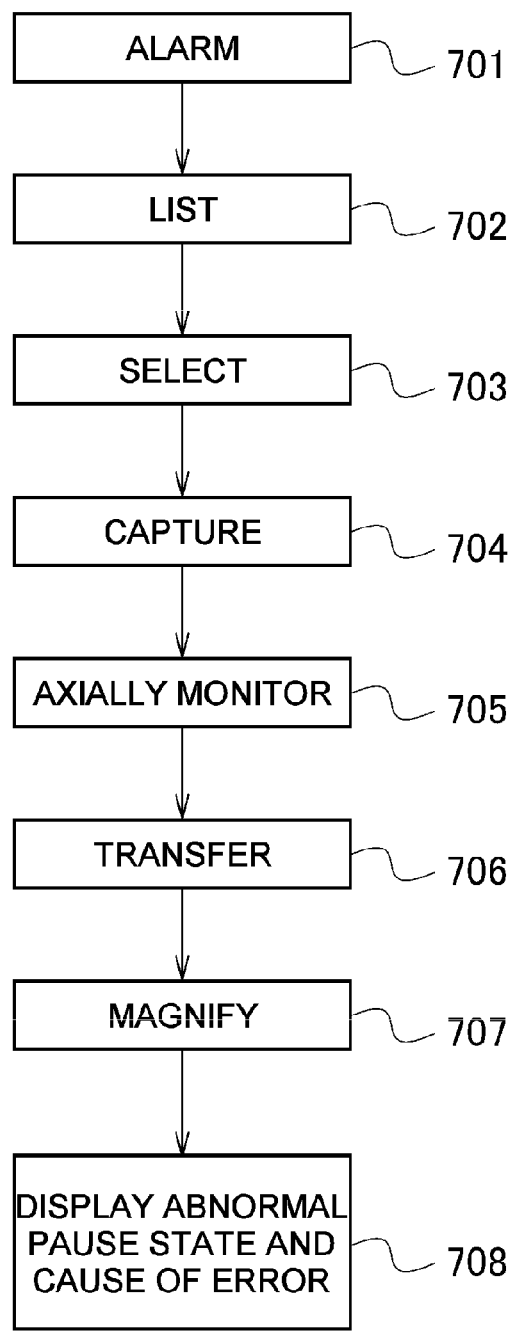
FIG. 7 is a flowchart illustrating a flow of alarm information display processing of the substrate processing apparatus according to one embodiment of the present invention.
Figure 8:
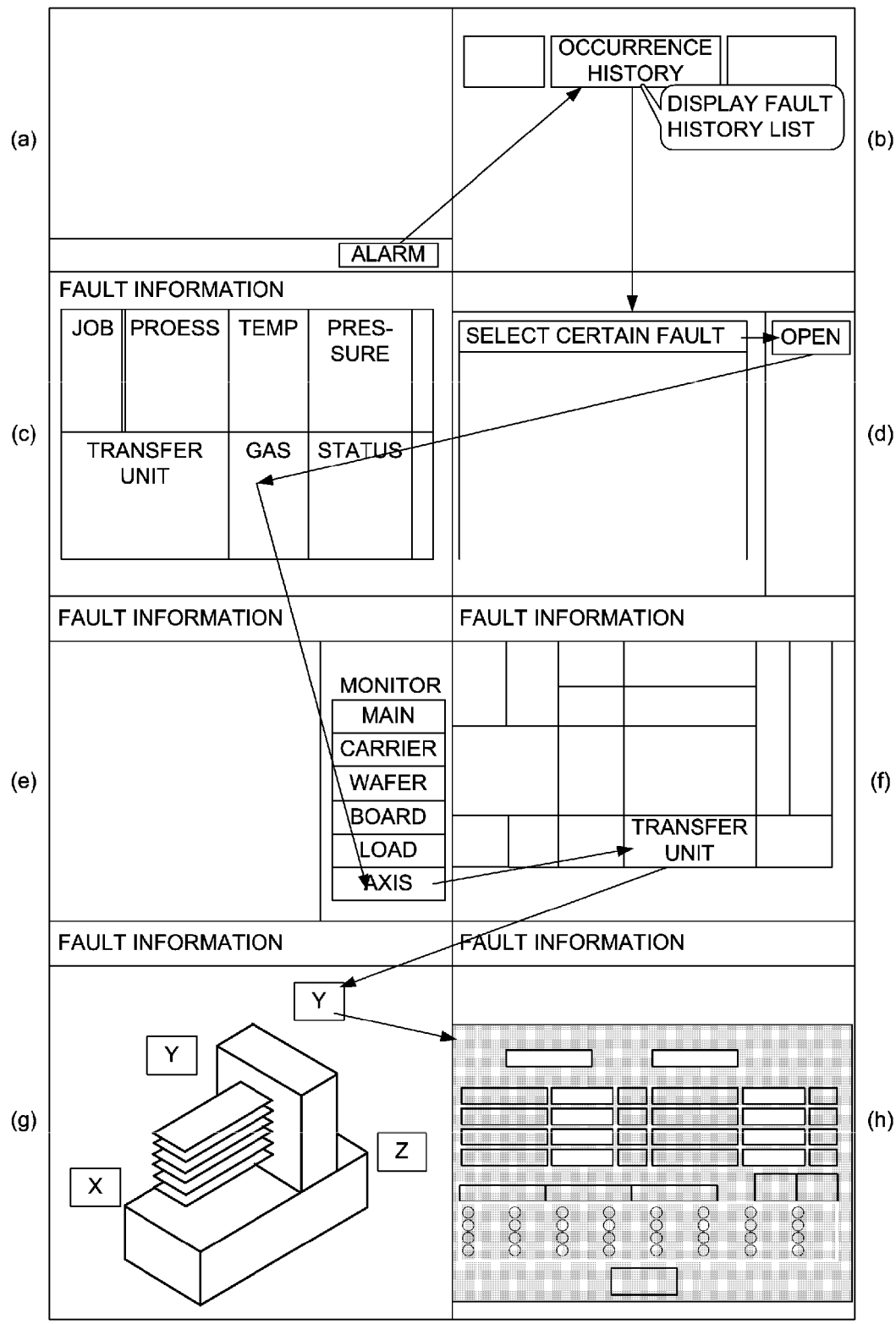
FIG. 8 is an explanatory diagram illustrating a change of a manipulation screen at the time of the alarm displayed on a display unit of the substrate processing apparatus according to one embodiment of the present invention.

Next, the manipulation screen of the display unit corresponding to the above-described flow as shown in FIGS. 6 and 7 will be described with reference to FIG. 8. FIG. 8 shows changes in screen of the display unit until the sensed data is displayed on a manipulation screen when a transfer mechanism is abnormally paused (when an alarm is raised). The changes are represented by arrows.

FIG. 8a shows a system main screen for observing a current system state, FIG. 8b shows an alarm menu screen for checking an alarm which is being raised or has been raised in a semiconductor manufacturing apparatus, FIG. 8c shows a fault history list screen for displaying a list of alarms raised up to now in the semiconductor manufacturing apparatus, FIG. 8d shows a capture screen in which a system main screen is captured as a screen for displaying a state of a system when an alarm is raised, FIG. 8e shows a transfer main screen for displaying a state of the transfer mechanism when an alarm is raised, FIG. 8f shows an axis monitor screen for displaying a menu as an icon to refer to a state of each axis of the transfer mechanism when an alarm is raised, FIG. 8g shows an axis monitor information display screen for enlarging and displaying axis monitor information of the transfer unit provided in a device when an alarm is raised, and FIG. 8h shows a display screen (a manipulation screen) for determining motion control state alarm information in the abnormal pause, which is the gist of this embodiment.

By editing parameters of each transfer mechanism using the manipulation unit 70, the parameter editing program stored in the data storage means 44 of the main control unit 41 is executed, and a parameter editing screen (not shown) is displayed on the display unit 73. The transfer processing is initiated based on the edited parameters.

After the initiation of the transfer processing, a screen is changed into a system screen for observing a state of a system (FIG. 8a). When an "alarm" button of the system main screen is clicked on the system screen while predetermined alarm information is displayed (an alarm is raised), the system screen is changed into an alarm menu screen (FIG. 8b), and an "occurrence history" button is displayed. When the occurrence history button is clicked, the alarm menu screen is changed into a future history list screen, and a fault history list is displayed (FIG. 8c). In this case, a certain fault is selected from the fault history list to click an "open" button. When the "open" button is clicked, the fault history list screen is changed into a capture screen in which the system main screen is captured during the abnormal pause (FIG. 8d).

Here, when a transfer main region in the capture screen is clicked, the capture screen is changed into a transfer main screen, and an "axis monitor" button is displayed (FIG. 8e). When the "axis monitor" button is clicked, the transfer main screen is changed into an axis monitor screen. Here, an icon of each of the transfer mechanisms appears, and a certain transfer mechanism that has been abnormally paused is displayed with emphasis simultaneously. A wafer transfer unit is shown in the shown example (FIG. 8f). When the icon of the certain wafer transfer unit is clicked, the axis monitor screen is changed into a wafer transfer unit screen, and a certain fault-generated axis (a Y axis button according to this embodiment) is displayed with emphasis (FIG. 8g). When the displayed fault-generated axis is selected, the wafer transfer unit screen is changed into an alarm information screen, and a motion control state and an abnormal end cause are displayed when an error occurs (FIG. 8h). Also, when buttons of the other axes (X axis, Z axis, etc.) where a fault is not generated are pressed, a motion control state of the other axes (X axis, Z axis, etc.) is displayed when the error occurs. In this case, there is no need to mention that a configuration of the screen is also identical to that of the screen as shown in FIG. 8h.

As described above, the system main screen is changed into the alarm information screen through the repeated manipulation in this embodiment, but the manipulation screen may be automatically changed into the alarm information screen by operating the above-described alarm information display program. In the same manner, the manipulation screen may be automatially changed into the screen for enlarging and displaying a transfer mechanism in which a fault is generated.

[Alarm Information Screen]

Next, the above-described alarm information screen of FIG. 8h will be described in an enlarged form with reference to FIG. 9.

(Alarm Information)

Figure 9:
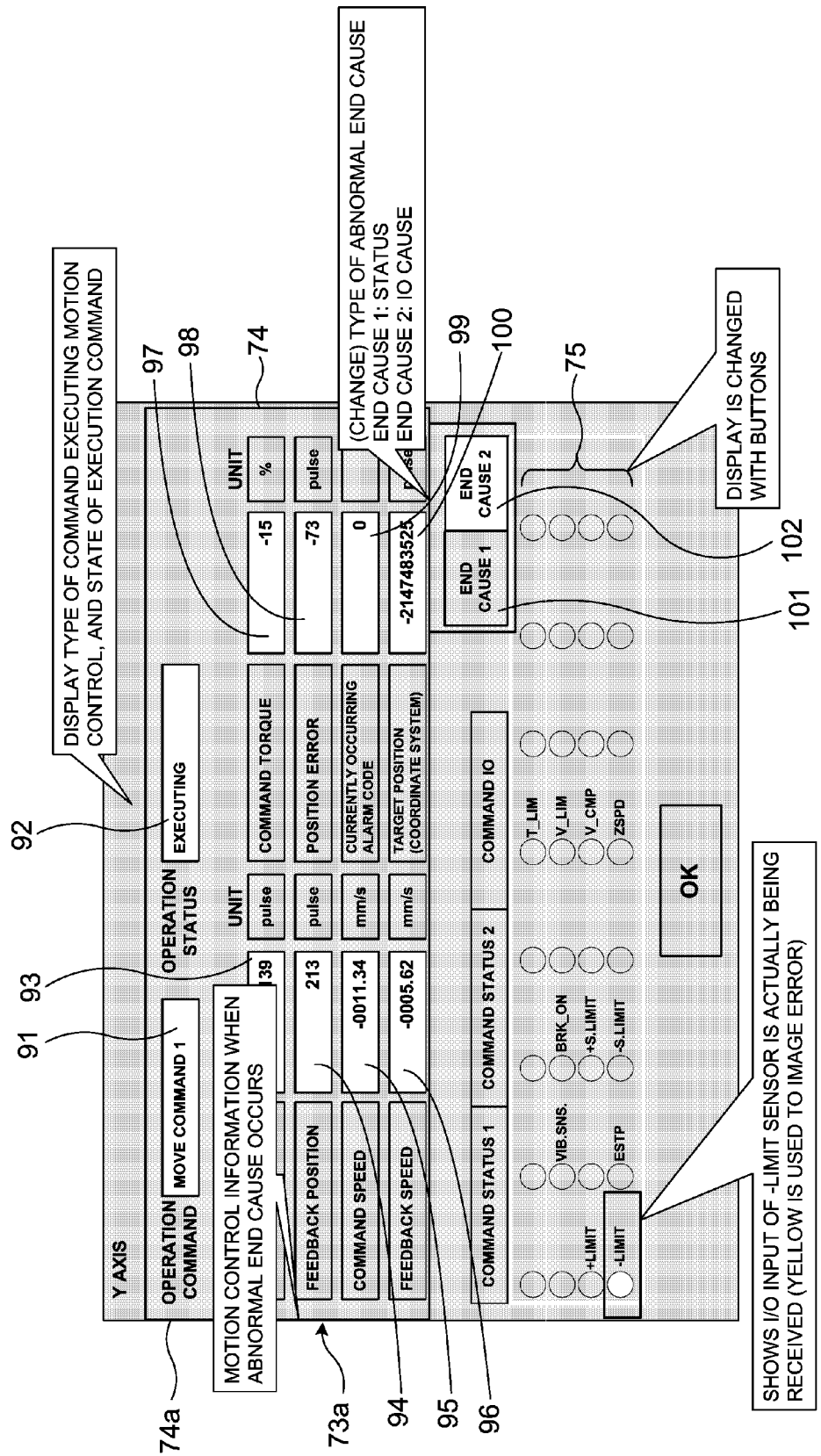
FIG. 9 is an explanatory diagram of the manipulation screen displaying a motion control state at the time of the alarm in the substrate processing apparatus according to one embodiment of the present invention.

FIG. 9 shows one example of alarm information displayed on the manipulation screen 73a of the display unit. Here, motion control information is displayed on the manipulation screen 73a during the abnormal pause of the second actuator 62, and a pause cause detected by the state detection sensor 68 is displayed. That is, FIG. 9 shows an alarm information screen in which the sensed data is displayed when an error occurs in the Y axis of the wafer transfer unit.

(Description of Window)

In FIG. 9, reference numeral 74a represents a command display window for displaying a type of commands by which the motion control is executed, reference numeral 74 represents a control information display window for displaying a current value of the motion control information when an abnormal end cause is generated, and reference numeral 75 represents an alarm information display window for displaying an abnormal end cause.

(Initiation of Alarm Information Display Program)

When the second actuator 62 is paused, the sensed data including the pause cause detected by the state detection sensor 68 is output together with an alarm signal, and the main control unit 41 receives the alarm signal via the transfer control unit 39. In this case, the alarm information display program is initiated.

(Command Display Window)

An operation command 91 and an operation status 92 are displayed on the command display window 74a. Here, if the operation command 91 is, for example, displayed as "move command 1," and "move command 2", the operation status 92 is displayed as "executing," and "pausing." Therefore, a state of the execution command can be checked.

(Control Information Display Window)

Current values of eight items which are set in advance along each axis of the transfer mechanism to be controlled are displayed on the control information display window 74. In the shown example, motion control information is displayed when an abnormal end cause is generated. For example, current values of items set with respect to each axis of the transfer mechanism to be controlled and the sensed data from each of the sensors provided in the transfer mechanism are displayed in FIG. 9. The sensed data from each of the sensors is data that has been accumulated in the data storage means 305. Also, the motion control information according to the Y axis of the wafer transfer plate 25 is displayed here.

Reference numeral 93 represents a command position (a parameter) of the Y axis of the wafer transfer plate 25. Reference numeral 94 represents actual sensed data (a feedback position) from the sensor corresponding to the command position.

Reference numeral 95 represents a command speed (a parameter) of the Y axis of the wafer transfer plate 25. Reference numeral 96 represents actual output data (a feedback speed) corresponding to the command speed.

Reference numeral 97 represents a command torque (a limit value) of the Y axis of the wafer transfer plate 25. Reference numeral 98 represents a position error between a set value (a parameter) and a current value of the Y axis of the wafer transfer plate 25.

Reference numeral 99 represents a recently occurring alarm code of the Y axis of the wafer transfer plate 25. Reference numeral 100 represents a target position (a coordinate system) of the Y axis of the wafer transfer plate 25.

In the control information display window 74 as shown as one example in FIG. 9, it is shown that the sensed data of the Y axis of the wafer transfer plate 25 has not yet reached the set value (a parameter), and the transfer mechanism is abnormally paused. From such a cause, it can be seen that the wafer placing plate 25 is placed in a critical point of the Y axis in a direction of the pod 9 by lighting of a negative limit signal (−LIMIT, 77 in FIG. 10) (for example, by yellow lighting into which an error is imaged). Also, it can be seen that the I/O input of the −LIMIT sensor is being actually received. Therefore, it is possible to exactly check an operation state of the substrate transfer mechanism when an error is detected, and instantly determine an abnormal pause cause.

(Alarm Information Display Window)

Buttons 101 and 102 of end cause 1 and end cause 2 are displayed on the alarm information display window 75 to change a type of abnormal end causes. End cause 1 represents a status collected as cause information, and end cause 2 represents an I/O cause collected as I/O information. Also, only two types of the end causes are displayed in the shown example, but end cause buttons represented by end cause 3, end cause 4, etc. may be further added when there is a need to collect cause information in addition to the above-described end causes.

A display content of the pause cause is changed, depending on which button of either end cause 1 or end cause 2 is clicked, but, when the button of end cause 1 is clicked as shown in FIG. 9, eleven items of pause causes including the above-mentioned −LIMIT (77 in FIG. 10) may be displayed on the alarm information display window 75, and the corresponding ones of the eleven items may be lighted according to the pause causes detected by the state detection sensor 67. The details will be described later.

[Example of Alarm Information]

Figure 10A:
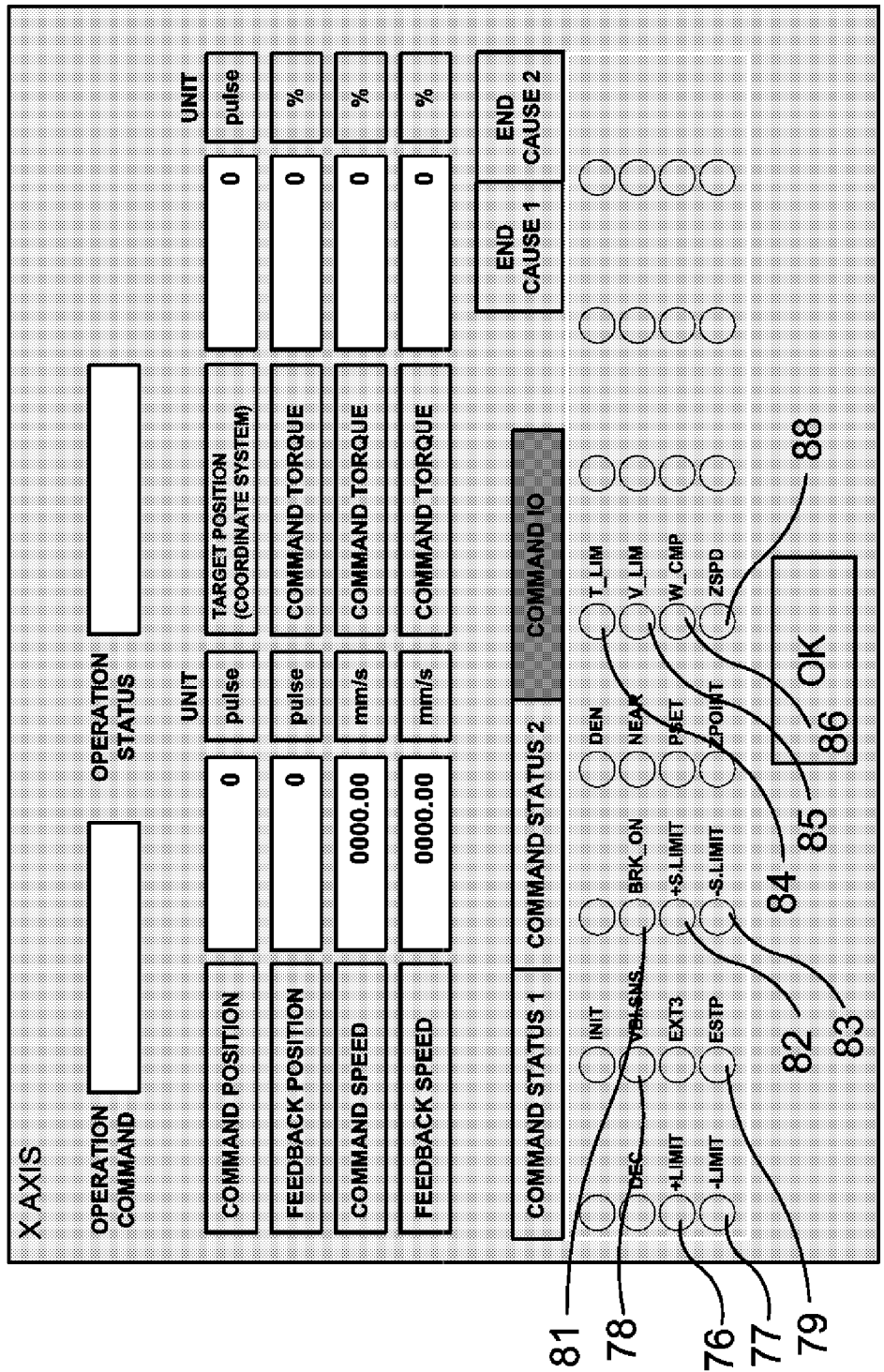
FIG. 10 is an explanatory diagram illustrating an alarm lamp in end cause 1 of the substrate processing apparatus according to one embodiment of the present invention.
Figure 10B:
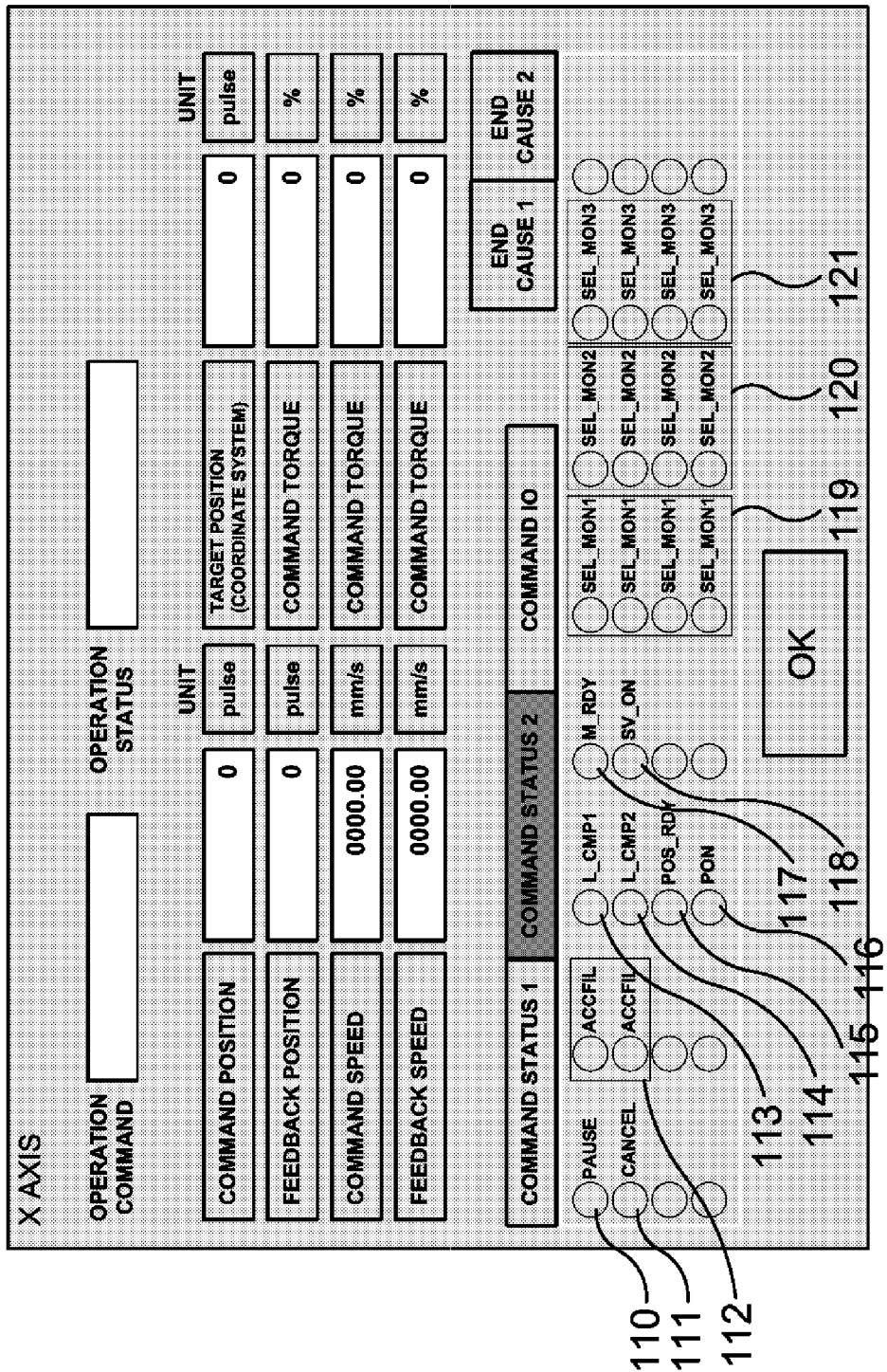
Figure 10C:
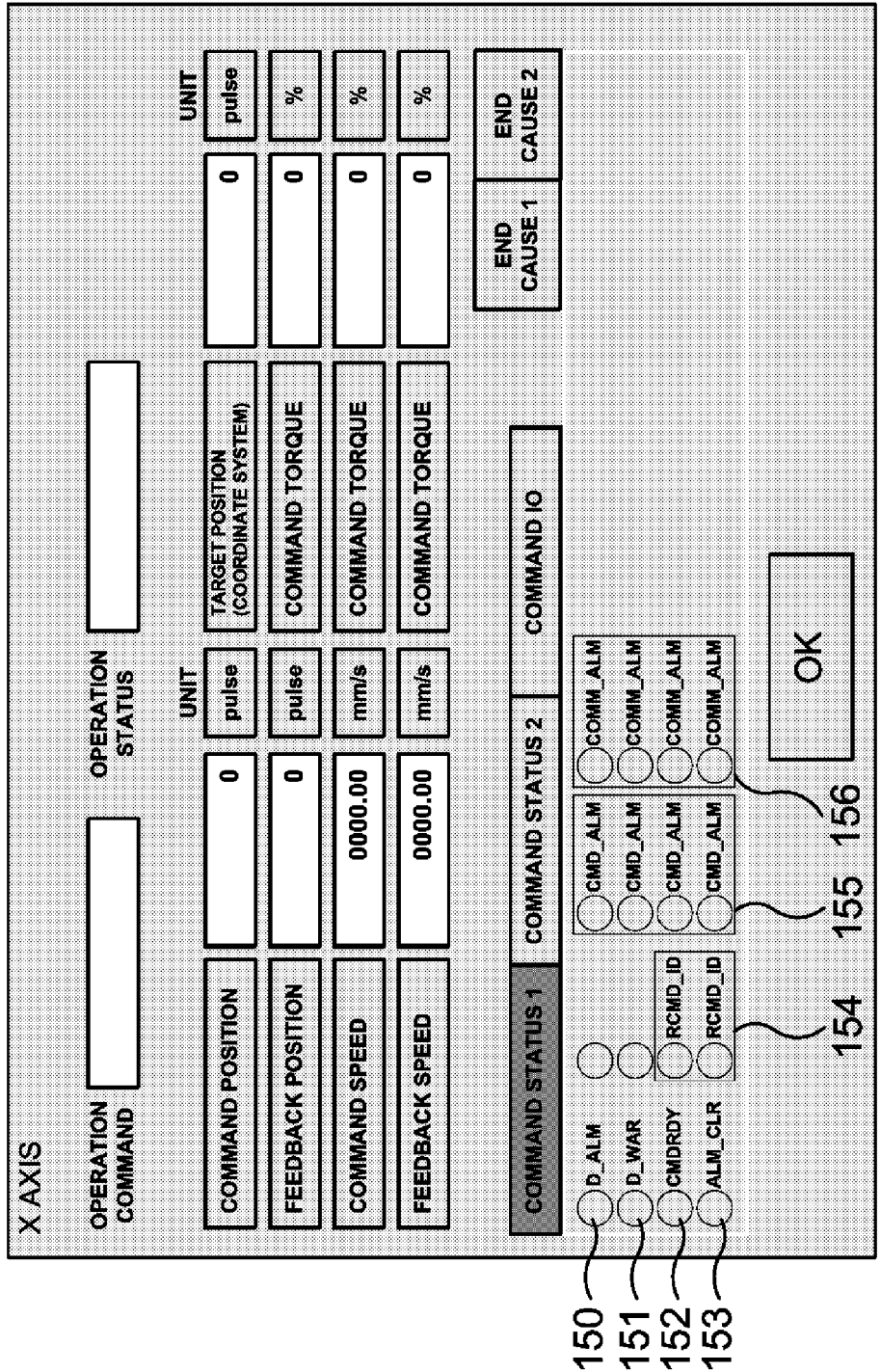

FIGS. 10A through 10C illustrate various pause causes detected and displayed by the state detection sensor 67 for command I/O, command status 2 and command status 1 when changed into "end cause 1."

FIG. 10A shows eleven items of the pause causes for command I/O, as described above. The eleven items will be described, as follows.

(Pause Cause)

Reference numeral 76 represents a positive limit signal (+LIMIT) indicating whether or not the wafer placing plate 25 is placed in a critical point of the Y axis in a direction of the boat 26.

Reference numeral 77 represents a negative limit signal (−LIMIT) indicating whether or not the wafer placing plate 25 is placed in a critical point of the X axis in a direction of the pod 9.

Reference numeral 78 represents a vibration sensor signal (VIB.SNS) indicating the detection of vibration using a vibration detection sensor, and reference numeral 79 represents an emergency pause signal (ESTP) indicating whether or not an emergency pause signal is input.

Reference numeral 81 represents a brake actuation signal (BRK_ON) indicating whether a brake works or is released.

Reference numeral 82 represents a positive soft limit signal (+S.LIMIT) indicating whether or not it is present in a logical position set in the front side of a positive limit.

Reference numeral 83 represents a negative soft limit signal (−S.LIMIT) indicating whether or not it is present in a logical position set in the front side of a negative limit.

Reference numeral 84 represents a torque limit execution signal (T_LIM) indicating whether or not it is operated within a torque limit value input from the manipulation unit 70.

Reference numeral 85 represents a speed limit execution signal (V_LIM) indicating whether or not it is operated within a preset speed input from the manipulation unit 70.

Reference numeral 86 represents a speed matching signal (V_CMP) indicating whether or not it accords with the preset speed input from the manipulation unit 70.

Also, reference numeral 87 represents a zero speed detection signal (ZSPD) indicating a detection state at a zero speed.

FIG. 10B shows 22 items of the pause causes for command status 2. The 22 items will be described, as follows.

Reference numeral 110 represents a primary pause state signal (PAUSE) that is a motion command. Reference numeral 111 represents a pause request information signal (CANCEL) from the computer.

Reference numeral 112 represents a position command filter signal (ACCFIL) of a motion command which is being executed. Here, the position command filter signal is presented by two bits. Reference numeral 113 represents a latch completion state signal (L_CMP1) of latch position 1.

Reference numeral 114 represents a latch completion state signal (L_CMP2) of latch position 2. Reference numeral 115 represents a position information-effective state signal (POS_RDY).

Reference numeral 116 represents motor power-ON information (PON). Reference numeral 117 represents a motor electrification-ready state signal (M_DRY).

Reference numeral 118 represents Servo motor-ON information (SV_ON). Reference numeral 119 represents a monitor type signal (SEL_MON1) obtained from the motor and presented by four bits.

Reference numeral 120 represents a monitor type signal (SEL_MON2) obtained from the motor and presented by four bits. Reference numeral 121 represents a monitor type signal (SEL_MON3) obtained from the motor and presented by four bits.

FIG. 10C shows fourteen items of the pause causes for command status 1. The fourteen items of the pause causes will be described, as follows.

Reference numeral 150 represents an alarm occurrence state signal (D_ALM) of a driver. Reference numeral 151 represents a warning occurrence state signal (D_WAR) of the driver.

Reference numeral 152 represents a command ready signal (CMDRDY) indicating whether or not a driver may receive a command. Reference numeral 153 represents an alarm clear signal (ALM_CLR) for canceling an alarm.

Reference numeral 154 represents an ID signal (RCMD_ID) of a command transmitted to the driver and represented by two bits. Reference numeral 155 represents a response result signal (CMD_ALM) of the command transmitted to the driver and represented by four bits.

Reference numeral 156 represents a communications state signal (COMM_ALM) with the driver, which is represented by four bits.

[Example of Alarm Information]

Hereinafter, FIG. 10A among FIGS. 10A through 10C will now be described in further detail.

As one example of command I/O alarm information of end cause 1 displayed on the monitor 73 corresponding to FIG. 10A, pause causes detected by the state detection sensor 67 are displayed on the monitor 73 in FIGS. 11A through 11C. Also, motion control information the second actuator 61 is not displayed on the monitor 73.

(Overrun)

Only the +LIMIT 76 is lighted on the alarm information display window 75 shown in FIG. 11A, which indicates a pause caused when the wafer placing plate 25 is overrun in a direction of the boat 26.

(Vibration)

The +LIMIT 76 and the VIB.SNS 78 are lighted on the alarm information display window 75 shown in FIG. 11B, which indicates a pause caused when vibration generated by an overrun transfer speed of the wafer 18 or vibration generated by collision of the wafer placing plate 25 with something else is detected by the vibration detection sensor.

(Excess of Torque Limit Value)

The +LIMIT 76 and the T_LIM 84 are lighted on the alarm information display window 75 shown in FIG. 11C, which indicates a pause caused when the wafer transfer mechanism 24 is operated in a range exceeding the torque limit value input from the manipulation unit 70.

(Reasons for +LIMIT Lighting)

Meanwhile, the +LIMIT 76 is lighted in FIGS. 11B and 11C. This is because the wafer transfer mechanism 24 is paused at a maximum speed when an error is detected by the state detection sensor 67.

(Power System)

Figure 14:
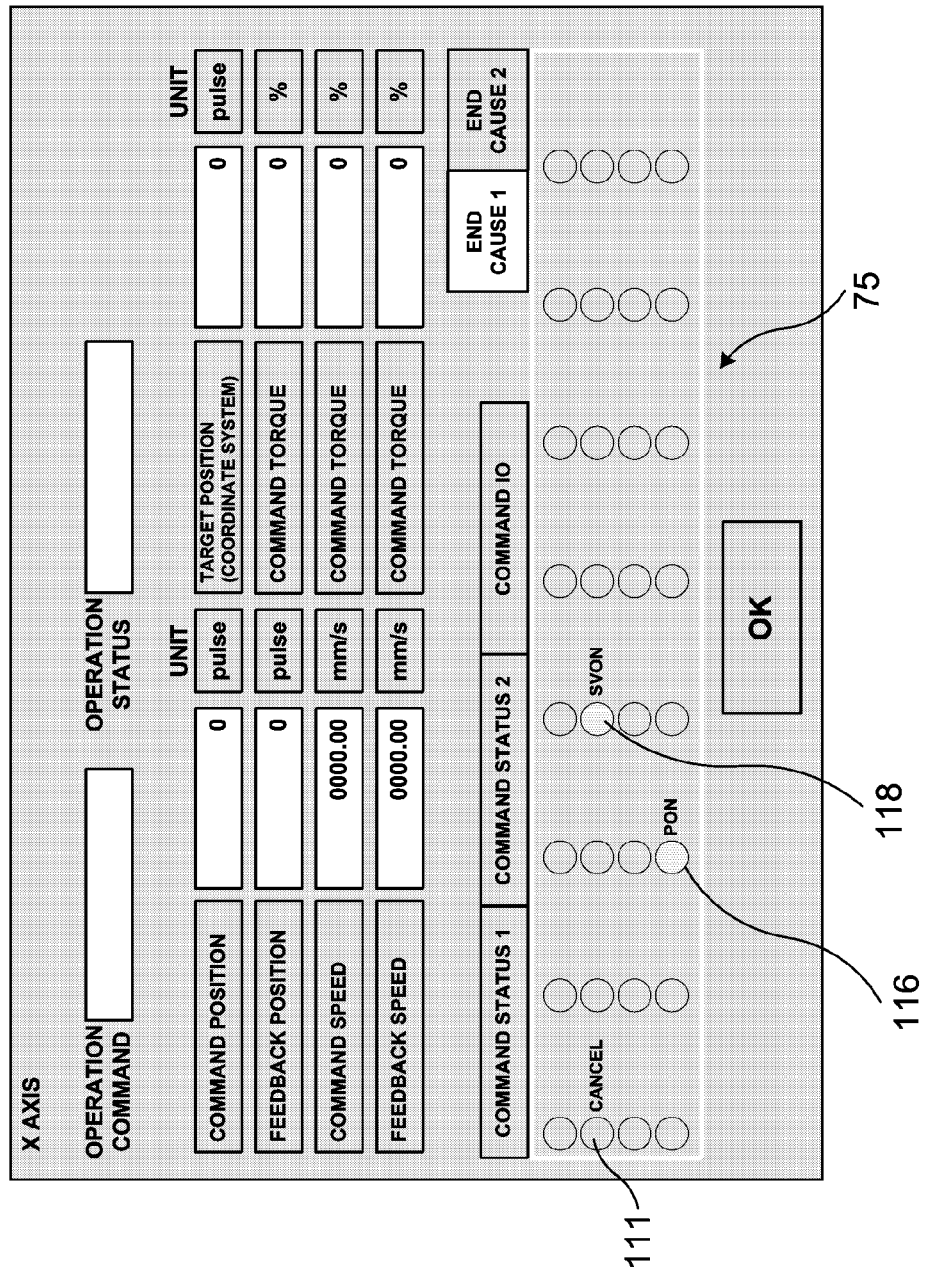
FIG. 14 is an explanatory diagram illustrating the alarm lamp in end cause 1 of the substrate processing apparatus according to one embodiment of the present invention.

Hereinafter, the power system alarm information of the wafer transfer mechanism 24 will now be described with reference to FIG. 14. The PON 116 and the SV_ON 118 are lighted on the alarm information display window 75 shown in FIG. 14, which indicates that the Y axis of the wafer transfer plate 25 is paused even when a motor power and the Servo motor are in an ON state.

Effects of Embodiments

When the motion control is abnormally paused in the substrate processing apparatus, an abnormal pause alarm is displayed on the display unit. However, no relationship with other axes in which an alarm does not occur may be found in the case of Comparative Example. Therefore, this may affect analysis of the pause cause or recovery work.

According to one embodiment of the present invention, the above-described problems are solved, and one or more effects are achieved, as follows.

(1) The substrate processing apparatus according to this embodiment includes the sensors provided in the transfer mechanism, the transfer control module, the transfer system controller and the manipulation unit, and is configured to display the sensed data transmitted by the sensors on the display unit when an error occurs. Therefore, a state of the transfer mechanism when the error occurs can be easily checked and a cause of the error can be readily determined.

(2) An abnormal pause cause of the motion control may be checked in the semiconductor manufacturing apparatus by installing a screen for displaying a motion control state on the display unit of the semiconductor manufacturing apparatus (FIG. 9). As the substrate processing apparatus, the semiconductor manufacturing apparatus according to the embodiment includes the manipulation unit having a display unit installed therein for displaying a screen for writing or editing a predetermined file or a screen for monitoring a state of various substrate processing mechanisms, and the control unit including the process system controller for controlling to process a substrate based on the instruction at the display unit and the transfer system controller for controlling to give an instruction to the transfer control module for controlling each of the transfer mechanisms and transfer the substrate. Here, the transfer system controller executes a predetermined instruction to the transfer control module based on the contents of the file downloaded from the manipulation unit, and the manipulation unit is configured to display the sensed data, which is notified of via the transfer control module from the various sensors provided in the transfer mechanism to be controlled, on the display unit when the transfer mechanism is abnormally paused during the control of the transfer mechanism.

As a result, when the transfer mechanism is abnormally paused, the sensed data from the various sensors provided in the transfer mechanism is displayed on the display unit, which makes it possible to easily check an abnormal pause state of the transfer mechanism that is abnormally paused. Since the sensed data is notified of via the transfer control module for controlling each of the transfer mechanisms, the abnormal pause cause of the abnormally paused transfer mechanism may be readily checked on the display unit. The certain reliability of the abnormal pause cause may be improved.

(3) The display unit includes a setting screen for setting parameters along each axis of the transfer mechanism to be controlled. When the display unit includes the setting screen for setting the parameters along each axis of the transfer mechanism as described above, a setting parameter for controlling each axis of the transfer mechanism may be displayed on the display unit. Therefore, the abnormal pause state of each axis of the transfer mechanism may be checked more easily in a parameter level when an abnormal pause occurs.

(4) The display unit includes a monitor screen for displaying current values of parameters set with respect to each axis of the transfer mechanism to be controlled and the sensed data from various sensors provided in the transfer mechanism. Since the display unit includes the monitor screen for displaying the current values of the parameters set with respect to each axis of the transfer mechanism to be controlled and the sensed data from the various sensors provided in the transfer mechanism as described above, a detection value may correspond to the set value. Therefore, the abnormal pause state of each axis of the transfer mechanism may be checked more easily during the abnormal pause.

(5) The sensed data from the various sensors represents a cause of the error detected by the various sensors, and the monitor screen includes a means for displaying the cause of the error. Since the display unit includes the monitor screen for displaying the current values of the parameters set with respect to each axis of the transfer mechanism to be controlled and the sensed data from the various sensors provided in the transfer mechanism as described above, a current value may correspond to the cause of the error. Therefore, the abnormal pause state and the cause of the error of each axis of the transfer mechanism may be checked more easily during the abnormal pause.

(6) The transfer control module has a function of accumulating the sensed data from the various sensors provided in the transfer mechanism to be controlled when the substrate transfer mechanism is operated. Since the transfer control module has the function of accumulating the sensed data from the various sensors provided in the transfer mechanism to be controlled when the substrate transfer mechanism is operated as described above, an error of the sensed data may be prevented from being occurring. Also, since a history stored until the transfer mechanism is abnormally paused may be confirmed based on the accumulated sensed data, the abnormal pause state of the transfer mechanism may be checked more readily. In particular, when the accumulated sensed data is data obtained from the initiation to the termination of the operation of the transfer mechanism, the abnormal pause state and the cause of the error may be checked more easily. Also, since the abnormal pause cause may be left as a record, statistics may be compiled of the abnormal pause cause and life span management/recurrence prevention may be advantageous.

Since a device for controlling the axis of the transfer mechanism to be controlled at the same cycle is provided, and has a function of storing information on the abnormal pause cause as a history during the control, an ON/OFF error in the sensors can be prevented. In particular, the data processing cycle between the sensors and the transfer control module is shorter than the data processing cycle between the transfer control module and the transfer system controller. Therefore, since the data collection may be performed at a small cycle in which the ON/OFF of the sensors may be recognized, an ON/OFF error in the sensors can be prevented with certainty. The data processing cycle between the sensors and the transfer control module is in a range from several μsec to several msec. Therefore, since the ON/OFF of the sensors may be performed to collect data at a cycle from several μsec to several msec, an ON/OFF error in the sensors can be prevented with certainty.

Also, when the data processing cycle is shortened to the same cycle as described above, the chattering information may be collected, thereby improving specific reliability of alarm notification and an abnormal pause cause when an error occurs.

(7) The transfer control module has a function of accumulating a large amount of the sensed data from the various sensors, which are provided in the transfer mechanism to be controlled, according to time. Since the transfer control module has a function of accumulating a large amount of the sensed data from the various sensors, which are provided in the transfer mechanism to be controlled, according to time as described above, it is possible to compare the sensed data in the transfer mechanisms on the same time axis, or the sensed data between the transfer mechanisms. Therefore, the abnormal pause state and the pause cause of the transfer mechanism may be checked more readily.

(8) Since the transfer control module reports the sensed data from the various sensors, which are provided in the transfer mechanism to be controlled, to the transfer system controller when an error occurs, it has effects such as notification of a trigger for terminating the motion control, reference to correlation between a change in value of the encoder and input sensor information, determination of the abnormal pause cause from sensor information input when the motion control is abnormally paused, and checking of a current state of the motor driver.

Also, the transfer control module includes the sensed data from the various sensors provided in each axis of the transfer mechanism to be controlled when an error occurs, and the sensed data provided in the sensors provided in the axis in which an error occurs and the sensors provided in the axis in which an error does not occur, and reports these sensed data to the transfer system controller. As a result, from the reported sensed data, the transfer system controller may determine whether or not the transfer mechanism is abnormally paused due to the interference of the plurality of axes when the transfer mechanism is in an abnormal pause state, for example, has the plurality of axes which operate parallel to one another.

(9) According to this embodiment, the following information may be checked when the motion control is abnormally paused: an abnormal pause state of the abnormally paused axis, a state of the same time in the axis which is abnormally paused, an abnormal pause cause of the abnormally paused axis, and an abnormal pause state/cause. The recovery work may be readily performed by checking such information. Also, since the abnormal pause cause may be left as a record, statistics may be compiled of the abnormal pause cause and life span management/recurrence prevention may be advantageous.

(10) The transfer control module also includes the storage means for storing the sensed data transmitted by the sensors provided in each axis of the transfer mechanism, and is configured to store the sensed data in the storage means while operating each axis simultaneously, delete the sensed data in the storage means when the operation is OK, and store the sensed data in the storage means when the operation is NG. As a result, only the data required to determine the NG operation and find its cause may be stored in the storage means, which leads to effective use of resources such as the storage means.

(11) The transfer control module is preferably configured to notify the manipulation unit of at least data stored in the storage means, and the sensed data, which is transmitted by the sensors provided respectively in the axis in which an error occurs or the axis in which an error does not occur, respectively, via the transfer system controller. As a result, from the reported sensed data, the transfer system controller may determine whether or not the transfer mechanism is abnormally paused due to the interference of a plurality of axes when the transfer mechanism is in an abnormal pause state, and, for example, has the plurality of axes which operate parallel to one another.

(12) The display unit includes the alarm information screen for displaying at least the current values of the items set along each axis of the transfer mechanism and the sensed data from the sensors provided in each axis of the transfer mechanism, and uses the manipulation unit to display the sensed data, which is transmitted by the sensors provided in the axis in which an error occurs, on the alarm information screen when the transfer mechanism is abnormally paused. Therefore, a state of the transfer mechanism may be checked more readily when an error occurs, and the cause of the error may be determined more easily.

(13) Since the data collection may be performed at a small cycle in which the ON/OFF of the sensors may be recognized by adjusting the data processing cycle between the sensors and the transfer control module and the data processing cycle between the transfer control module and the transfer system controller to different levels, an ON/OFF error in the sensors can be prevented. Therefore, the state of the transfer mechanism may be checked more exactly. Also, each axis of the transfer mechanism is operated, and the sensed data is stored in the storage means simultaneously. Here, the sensed data in the storage means is deleted when the operation is OK, whereas the sensed data is stored in the storage means when the operation is NG. As a result, only the data required to determine the NG operation and find its cause may be stored in the storage means, which leads to effective use of resources such as the storage means.

Also, the substrate processing apparatus of the present invention may apply to a device for processing a glass substrate, such as an LCD device, as well as the semiconductor manufacturing apparatus. Also, only the vertical device has been described in this embodiment, but a single-type apparatus, a horizontal device, and other substrate processing apparatuses, for example, an exposure device, a lithographic device, a coating device, etc., may be applied in the same manner.

[Note]

Hereinafter, preferred embodiments of the present invention will now be described in further detail.

(Note 1)

There is provided a substrate processing apparatus including:

at least one sensor provided in a transfer mechanism for transferring a substrate;

a transfer control module for receiving a sensed data transmitted by the at least one sensor, a transfer system controller for controlling the transfer control module; and a manipulation unit at least including a display unit for displaying a state of the transfer mechanism based on the sensed data, wherein at least the sensed data transmitted by the sensor is displayed on the display unit when an error occurs.

(Note 2)

The display unit preferably includes a setting screen for setting items along each axis of the transfer mechanism to be controlled.

(Note 3)

The display unit preferably includes a monitor screen for displaying current values of the items set along each axis of the transfer mechanism to be controlled, and the sensed data from various sensors provided in the transfer mechanism.

(Note 4)

The sensed data from the various sensors preferably represents causes of the errors detected by the various sensors, and the monitor screen preferably includes a means for displaying the causes of the errors.

(Note 5)

The transfer control module preferably has a function of storing the sensed data from the various sensors provided in the transfer mechanism to be controlled when the substrate transfer mechanism is operated.

(Note 6)

The transfer control module preferably has a function of storing the sensed data from the various sensors provided in the transfer mechanism to be controlled in multiple time series.

(Note 7)

The transfer control module preferably includes a storage means for storing the sensed data transmitted by the at least one sensor provided in each axis of the transfer mechanism, and is configured to store the sensed data in the storage means while operating each axis, delete the sensed data in the storage means when an operation is OK, and store the sensed data in the storage means when the operation is NG.

(Note 8)

The storage means preferably stores the sensed data transmitted by the sensors provided in each axis for at least a period ranging from an initiation to a termination of an operation of the transfer mechanism.

(Note 9)

When the operation is NG, the transfer control module is preferably configured to notify the manipulation unit of a data including at least the sensed data in the storage means via the transfer system controller.

(Note 10)

The transfer control module is preferably configured to notify the manipulation unit of at least a data stored in the storage means, and the sensed data, which is transmitted by the sensors provided respectively in the axis in which an error occurs or the axis in which an error does not occur, respectively, via the transfer system controller.

(Note 11)

The data stored in the storage means preferably includes at least one control instruction data for controlling the transfer mechanism in addition to the sensed data.

(Note 12)

There is provided a method of displaying an error of a substrate processing apparatus, the apparatus including: at least one sensor provided in a transfer mechanism for transferring a substrate; a transfer control module for receiving a sensed data transmitted by the at least one sensor; a transfer system controller for controlling the transfer control module; and a manipulation unit at least including a display unit for displaying a state of the transfer mechanism based on the sensed data, the method including: displaying at least the sensed data transmitted by the at least one sensor on the display unit when the error occurs.

(Note 13)

The display unit preferably includes an alarm information screen for displaying at least a current value of the item set along each axis of the transfer mechanism, and the sensed data from the sensor provided in each axis of the transfer mechanism, and is configured to display the sensed data, which is transmitted by the sensor provided in the axis in which an error occurs when the transfer mechanism is abnormally paused, on the alarm information screen using the manipulation unit.

(Note 14)

There is provided a substrate processing apparatus including at least:

a sensor provided in a transfer mechanism for transferring a substrate, a transfer control module for receiving a sensed data transmitted by the sensor, and a transfer system controller for controlling the transfer control module, wherein a data processing cycle between the sensor and the transfer control module is different from a data processing cycle between the transfer system controller and the transfer control module, and wherein the transfer control module includes a storage means for storing the sensed data transmitted by the sensor provided in each axis of the transfer mechanism, and is configured to store the sensed data in the storage means while operating each axis simultaneously, delete the sensed data in the storage means when the operation is OK, and store the sensed data in the storage means when the operation is NG.

(Note 15)

There is provided a substrate transfer control method including steps of:

(a) displaying a screen for monitoring at least a state of a transfer mechanism;

(b) controlling the transfer mechanism to transfer a substrate by transmitting a control instruction data to a transfer control module for controlling the transfer mechanism;

(c) storing a sensed data transmitted by a sensor provided in each axis of the transfer mechanism in a storage means; and (d) storing the sensed data in the storage means while operating each axis simultaneously, deleting the sensed data in the storage means when an operation is OK, and storing the sensed data in the storage means when the operation is NG.

(Note 16)

There is provided a substrate processing apparatus including:

at least one sensor provided in a transfer mechanism for transferring a substrate;

a transfer control module for receiving a sensed data transmitted by the at least one sensor, a transfer system controller for controlling the transfer control module; and a manipulation unit at least including a display unit for displaying a state of the transfer mechanism based on the sensed data, wherein a data processing cycle between the at least one sensor and the transfer control module, a data processing cycle between the transfer control module and the transfer system controller, and a data processing cycle between the transfer system controller and the manipulation unit are different from one another.

What is claimed is:

1. A substrate processing apparatus comprising:
    at least one sensor provided in each axis of a transfer mechanism configured to transfer a substrate;
    a transfer control module comprising a storage means for temporarily storing a sensed data received from each of the at least one sensor; and
    a manipulation unit at least comprising a display unit for displaying a state of the transfer mechanism based on the sensed data,
    wherein the transfer control module is configured to store the sensed data from a start of an operation of the transfer mechanism to a termination of the operation of the transfer mechanism in the storage means while operating the transfer mechanism, delete the sensed data when a detection result data detected by the at least one sensor indicates the operation is OK at the termination of the operation of the transfer mechanism, and store the sensed data in the storage means when the detection result data detected by the at least one sensor indicates the operation is NG at the termination of the operation of the transfer mechanism, and
    wherein the manipulation unit displays at least the sensed data detected by the at least one sensor on the display unit when the operation is NG.

2. The substrate processing apparatus according to claim 1, wherein a data including the sensed data stored in the storage means is transmitted to the manipulation unit via the transfer system controller when an error occurs due to the operation being NG.

3. The substrate processing apparatus according to claim 2, wherein the data comprises an operation parameter which is a set value configured as an item when performing a motion control.

4. The substrate processing apparatus according to claim 3, wherein the operation parameter is the set value selected from a command position, a feedback position, a command speed, a feedback speed, a command torque, a position deviation, an alarm code and a target position (coordinate system).

5. The substrate processing apparatus according to claim 3, wherein the transfer mechanism and a position of each axis of a transfer mechanism are controlled in response to the operation parameter in the motion control.

6. The substrate processing apparatus according to claim 1, wherein the transfer mechanism comprises at least one of a pod transfer device, a wafer transfer mechanism, a boat elevator and a boat.

7. The substrate processing apparatus according to claim 6, wherein pod transfer device comprises a CZ-axis and a CX-axis and is configured to elevate and retreat along the CZ-axis and the CX-axis, respectively, while supporting a pod.

8. The substrate processing apparatus according to claim 6, wherein the wafer transfer mechanism comprises a wafer placing plate, and
    the operation parameter includes an X axis for adjusting an operation of the wafer placing plate, a Y axis for adjusting an entrance angle when the wafer placing plate transfers the wafer to the boat, a Z axis for adjusting an entrance height when the wafer placing plate transfers the wafer to the boat and a V axis for adjusting a distance for insertion of the wafer to the boat by a fine adjustment of the Z axis when the wafer placing plate supporting receives a wafer from a first place and disposes the wafer in a second place.

9. The substrate processing apparatus according to claim 1, wherein, when the detection result data of one of the at least one sensor indicates the operation is NG, the sensed data for each axis stored even for one of the at least one sensor having the detection result data thereof indicating the operation is OK.

10. The substrate processing apparatus according to claim 1, wherein the transfer control module independently controls the transfer mechanism so that the transfer mechanism without an error continues to perform a transfer operation without pausing all of the transfer mechanism.

11. The substrate processing apparatus according to claim 10, wherein the transfer control module controls each axis of the transfer mechanism to be controlled at a same cycle.

12. The substrate processing apparatus according to claim 10, wherein the transfer control module is connected to a motor of the transfer mechanism, includes a function for outputting a pulse signal to the motor driver at a predetermined pulse number or a frequency, and outputs a control pulse to the motor driver according to the operation parameters including a target position, a speed and an acceleration/deceleration rate.

13. The substrate processing apparatus according to claim 12, wherein the transfer control module controls each axis of the transfer mechanism to be controlled at a same cycle.

14. The substrate processing apparatus according to claim 12, wherein a control cycle between the transfer control module and the motor driver ranges from several hundred microseconds to several milliseconds.

15. The substrate processing apparatus according to claim 12, wherein a control cycle between the transfer control module and the motor driver enables a recognition of an ON/OFF state of the at least one sensor.

16. The substrate processing apparatus according to claim 1, wherein the display unit is configured to display an alarm information screen showing at least current values of items set with respect to each axis of the transfer mechanism to be controlled and the sensed data from each of the at least one sensors provided in the transfer mechanism, and the manipulation unit is configured to display at least the sensed data of one of the at least one sensor provided at the axis with an error on the alarm information screen when the transfer mechanism is abnormally paused.

17. The substrate processing apparatus according to claim 16, wherein a control information of an abnormal pause of the transfer mechanism and a cause of the abnormal pause detected by the at least one sensor is displayed on the alarm information screen.

18. A method of displaying an error of a substrate processing apparatus
comprising: at least one sensor provided in each axis of a transfer mechanism configured to transfer a substrate; a transfer control module comprising a storage means for temporarily storing a sensed data received from each of the at least one sensor; and a manipulation unit comprising a display unit for displaying a state of the transfer mechanism based on the sensed data,
the method comprising:
storing the sensed data from a start of an operation of the transfer mechanism to a termination of the operation of the transfer mechanism in the storage means while operating the transfer mechanism;
deleting the sensed data when a detection result data detected by the at least one sensor indicates the operation is OK at the termination of the operation of the transfer mechanism;
store the sensed data in the storage means when the detection result data detected by the at least one sensor indicates the operation is NG at the termination of the operation of the transfer mechanism and transmitting a data including the sensed data stored in the storage means to the manipulation unit via the transfer system controller when an error occurs due to the operation being NG; and
displaying at least the sensed data detected by the at least one sensor on the display unit when the operation is NG.

19. A transfer control method comprising steps of:
(a) displaying a screen for monitoring at least a state of a transfer mechanism;
(b) controlling the transfer mechanism to transfer a substrate by transmitting a control instruction data to a transfer control module for controlling the transfer mechanism; and
(c) storing a sensed data transmitted by a sensor provided in each axis of the transfer mechanism in a storage means,
wherein the sensed data from a start of an operation of the transfer mechanism to a termination of the operation of the transfer mechanism is stored in the storage means while operating the transfer mechanism,
the sensed data is deleted when a detection result data detected by the at least one sensor indicates the operation is OK at the termination of the operation of the transfer mechanism,
the sensed data is stored in the storage means when the detection result data detected by the at least one sensor indicates the operation is NG at the termination of the operation of the transfer mechanism and transmitting a data including the sensed data stored in the storage means to the manipulation unit via the transfer system controller when an error occurs due to the operation being NG, and
displaying at least the sensed data detected by the at least one sensor on the display unit when the operation is NG.

20. A computer-readable recording medium storing a data collection program executed by a transfer control module, the program causing the transfer control module to execute:
(a) storing a sensed data from a start of an operation of a transfer mechanism to a termination of the operation of the transfer mechanism in a storage means while operating the transfer mechanism;
(b) detecting an error of the transfer mechanism with a sensor provided in the transfer mechanism;
(c) deleting the sensed data when a detection result data detected by the sensor indicates the operation is OK at the termination of the operation of the transfer mechanism, and store the sensed data in the storage means when the detection result data detected by the sensor indicates the operation is NG at the termination of the operation of the transfer mechanism.

* * * * *